United States Patent [19]

Koleske et al.

[11] Patent Number: 4,874,798
[45] Date of Patent: * Oct. 17, 1989

[54] PHOTOCOPOLYMERIZABLE COMPOSITIONS BASED ON EPOXY AND HYDROXYL-CONTAINING ORGANIC MATERIALS AND SUBSTITUTED CYCLOALIPHATIC MONOEPOXIDE REACTIVE DILUENTS

[75] Inventors: Joseph V. Koleske, Charleston, W. Va.; George T. Kwiatkowski, Green Brook, N.J.

[73] Assignee: Union Carbide Corporation, Danbury, Conn.

[*] Notice: The portion of the term of this patent subsequent to Jun. 3, 2003 has been disclaimed.

[21] Appl. No.: 798,363

[22] Filed: Nov. 18, 1985

Related U.S. Application Data

[63] Continuation of Ser. No. 464,571, Feb. 7, 1983, abandoned.

[51] Int. Cl.$^4$ .................. C08F 2/50; C08F 224/00; C08G 59/24; C08G 59/62
[52] U.S. Cl. ..................... 522/31; 522/170; 528/366; 528/393
[58] Field of Search .......... 522/170, 31; 528/366, 528/393

[56] References Cited

U.S. PATENT DOCUMENTS

| | | | |
|---|---|---|---|
| 3,896,090 | 7/1975 | Maximovich | 528/405 |
| 3,912,690 | 10/1975 | Yapp | 528/274 |
| 3,936,557 | 2/1976 | Watt | 204/159.11 |
| 3,956,241 | 5/1976 | Steele et al. | 528/112 |
| 3,962,182 | 6/1976 | Steele et al. | 528/170 |
| 3,977,996 | 8/1976 | Katzakian et al. | 528/89 |
| 3,978,026 | 8/1976 | Katzakian et al. | 528/89 |
| 4,026,705 | 5/1977 | Crivello | 522/15 |
| 4,086,293 | 4/1978 | Smith et al. | 525/411 |
| 4,173,476 | 11/1979 | Smith et al. | 430/280 |
| 4,184,004 | 1/1980 | Pines et al. | 428/266 |
| 4,192,924 | 3/1980 | Crivello | 521/125 |
| 4,218,531 | 8/1980 | Carlson | 430/280 |
| 4,231,951 | 11/1980 | Smith et al. | 260/446 |
| 4,256,828 | 3/1981 | Smith | 430/280 |
| 4,416,917 | 11/1983 | France et al. | 427/302 |
| 4,593,051 | 6/1986 | Koleske | 522/170 |

FOREIGN PATENT DOCUMENTS 916246 1/1963 United Kingdom .

OTHER PUBLICATIONS

Perkins, "New Developments", Journal of Radiation Curing, vol. 8, No. 1, Jan. 1981, p. 16.
Handbook of Epoxy Resins, Lee et al, pp. 13-8 to 13-10, 1967.
Copending U.S. patent application Ser. No. 369,835, Filed Apr. 19, 1982 Entitled "Photocopolymerizable Compositions Based on Epoxy and Hydroxyl-Containing Organic Materials", Joseph Victor Koleske.

Primary Examiner—John C. Bleutge
Assistant Examiner—Arthur H. Koeckert
Attorney, Agent, or Firm—Jean B. Mauro

[57] ABSTRACT

This invention is directed to photocopolymerizable compositions comprising an epoxide containing two or more epoxy groups, a poly (active hydrogen) organic compound, a photoinitiator and, as a reactive diluent, a substituted cycloaliphatic monoepoxide. The photocopolymerizable compositions have low viscosity and can be applied to suitable substrates by conventional methods and, after being cured to dry coating films, can have utility as automotive finishes, can finishes, appliance finishes, general metal finishes, adhesives, printing inks and the like.

12 Claims, No Drawings

PHOTOCOPOLYMERIZABLE COMPOSITIONS BASED ON EPOXY AND HYDROXYL-CONTAINING ORGANIC MATERIALS AND SUBSTITUTED CYCLOALIPHATIC MONOEPOXIDE REACTIVE DILUENTS

This application is a continuation of prior U.S. application Ser. No. 464,571, filing date, Feb. 7, 1983, now abandoned.

BRIEF SUMMARY OF THE INVENTION

1. Technical Field

This invention is directed in general to coating compositions and, in particular, to photocopolymerizable compositions comprising an epoxide containing two or more epoxy groups, a poly(active hydrogen) organic compound, a photoinitiator and, as a reactive diluent, a substituted cycloaliphatic monoepoxide.

2. Background Art

Governmental regulations have placed ever increasing restrictions on the amounts and types of organic volatiles permitted to escape into the atmosphere from coatings compositions. Considerable efforts have been expended to develop coatings compositions having a minimal amount of volatile organic components and this has led to development of radiation curable coatings, powder coatings, water borne coatings and high solid coatings. In these recent developments the amounts of roganic solvents present are minimal and consequently there is little or no atmospheric pollution.

In the field of radiation curable coatings, it is well known that coating compositions containing cycloaliphatic epoxides and hydroxyl-containing materials can be radiation cured by the use of onium salts such as FC-508 available from the 3M Company and UVE-1014 available from General Electric Company. The onium salts form shelf-stable formulations with cycloaliphatic epoxides and hydroxyl-containing materials in an environment free of ultraviolet light irradiation. When such onium salts are irradiated with ultraviolet light, a cationic catalyst composition is formed that cures the formulation into a coating film with little or no organic volatiles escaping into the atmosphere.

However, the cycloaliphatic epoxides used in the radiation curable coatings have a relatively high viscosity of about 300 to 500 centipoise or more. In addition, hydroxyl-containing materials such as organic polyols are oftentimes blended with the cycloaliphatic epoxide to improve certain coating properties such as flexibility and toughness of the coating. When the organic polyols are of sufficient molecular weight to improve flexibility of the cured coatings, the viscosity of the blended formulations is oftentimes increased even further. The high viscosity of the blended formulations precludes the application thereof to a suitable substrate by conventional techniques such as roll coating, spray and other methods of application. Solvents in general can be used to reduce the viscosity of the curable blended formulations. However, the solvents must be volatilized at some point in the curing process and such volatilization will negate the atmospheric pollution control benefits of radiation curable coatings which are considered to be essentially 100 percent solids coating systems. Thus, radiation curable coatings such as the ones hereinafter described which exhibit desirably low viscosity and produce good satisfactory cured coating films, are of great importance.

It has been found as a result of the present invention that certain substituted cycloaliphatic monoepoxides can be used as reactive diluents in photocopolymerizable coating compositions based on epoxy and hydroxyl-containing organic materials to produce curable coating formulations having desirable low viscosity. Such curable coating formulations require little or no organic solvent to improve flowability during application thereof by conventional methods to a suitable surface or substrate. The cured coating films prepared from these low viscosity photocopolymerizable coating formulations also exhibit highly desirable film properties as described more fully hereinbelow.

3. The present invention is directed to photocopolymerizable compositions comprising an epoxide containing two or more epoxy groups, a poly (active hydrogen) organic compound, a photoinitiator and, as a reactive diluent, a substituted cycloaliphatic monoepoxide. The invention is also directed to blend formulations comprising an epoxide containing two or more epoxy groups, a poly(active hydrogen) organic compound and a substituted cycloaliphatic monoepoxide. The above compositions can optionally contain a surfactant, filler, additives and an organic solvent where necessary. The photocopolymerizable compositions have desirably low viscosity and can be applied in a conventional manner such as roll coating, spray and the like and, after exposure to any source of radiation emitting actinic radiation at a wavelength within the ultraviolet and visible spectral regions, can be cured to dry coating films. The cured coating films are useful as automative finishes, can finishes, appliance finishes, business machine finishes, coil coating, house siding, general metal finishes, adhesives, printing inks and the like.

The invention is further directed to a process for preparing a cured film coating comprising: (1) mixing until homogeneous a photocopolymerizable composition comprising an epoxide containing two or more epoxy groups, a poly(active hydrogen) organic compound, a substituted cycloaliphatic monoepoxide and a photoinitiator; (2) applying the homogeneous photocopolymerizable composition as a film coating on a suitable surface or substrate; and (3) exposing the film coating to actinic irradiation at a wavelength within the ultraviolet and visible spectral regions or electron beam irradiation for a period of time sufficient to cure the film coating. The cured film prepared by the above described process is also a part of this invention.

Copending U.S. patent application Ser. No. 794,604, filed Nov. 6, 1985, now U.S. Pat. No. 4,812,488, a continuation of U.S. Ser. No. 464,568, filed on an even date herewith, now abandoned, describes photocopolymerizable compositions comprising a poly (active hydrogen) organic compound, a photoinitiator and, as a reactive diluent, a substituted cycloaliphatic monoepoxide. The photocopolymerizable compositions have low viscosity and can be applied to suitable substrates by conventional methods and, after curing, provide excellent pressure sensitive and heat-activated adhesive coatings.

In copending U.S. patent application Ser. No. 464,563, filed on an even date herewith, now U.S. Pat. No. 4,593,051, there is described photocopolymerizable compositions comprising an epoxide containing two or more epoxy groups, a polymer/poly (active hydrogen) organic compound and a photoinitiator. The cured coating compositions exhibit a clear appearance, good water resistance and can have utility as automotive finishes, appliance finishes, general metal finishing and the like.

Copending U.S. patent application Ser. No. 794,605, filed Nov. 6, 1985, now U.S. Pat. No. 4,818,776, a continuation of U.S. Ser. No. 464,580, filed on an even date herewith, now abandoned, describes photocopymerizable compositions comprising an epoxide containing two or more epoxy groups, a poly (active hydrogen) organic compound having at least some primary hydroxyl content and a photoinitiator. The cured coating compositions exhibit fast cure rates, good water resistance and can have utility as automotive finishes, appliance finishes, general metal finishing and the like.

In copending U.S. patent application Ser. No. 464,564, filed on an even date herewith, now abandoned, there is described photocopolymerizable compositions comprising an epoxide containing two or more epoxy groups, a photoinitiator and, as a reactive diluent, a substituted cycloaliphatic monoepoxide. The photocopolymerizable compositions have desirably low viscosity and can be applied to a suitable substrate in a conventional manner such as roll coating, spray and the like. The cured coatings are suitable for use in a variety of applications in the fileds of protective coatings and graphic arts.

Copending U.S. patent application Ser. No. 464,570, filed on an even date herewith, now abandoned, describes photocopolymerizable compositions comprising a photoinitiator selected from diazonium salts, onium salts and mixtures thereof and, as a reactive diluent, a cycloaliphatic epoxide. The photocopolymerizable compositions have desirably low viscosity and can be applied to suitable substrates by conventional methods.

Copending U.S. patent application Ser. No. 464,558, filed on an even date herewith, now U.S. Pat. No. 4,622,349, describes photocopolymerizable compositions comprising an epoxide containing two or more epoxy groups, a poly(active hydrogen) organic compound and a hydroxyl substituted cycloaliphatic monoepoxide. The photocopolymerizable compositions can be cured into coatings which have improved water resistance.

DETAILED DESCRIPTION

The epoxides which may be used herein contain two or more epoxy groups having the formula:

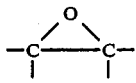

and have a viscosity of about 200, or higher, centipoise at 25° C. The epoxy groups can be terminal epoxy groups or internal epoxy groups. The epoxides are primarily cycloaliphatic epoxides. The cycloaliphatic epoxide resins may be blended with minor amounts of glycidyl type epoxides, aliphatic epoxides, epoxy cresol novolac resins, epoxy phenol novolac resins, polynuclear phenol-glycidyl ether-derived resins, aromatic and heterocyclic glycidyl amine resins, hydantoin epoxy resins, and the like, and mixtures thereof. These cycloaliphatic epoxide resins may also be blended with minor amounts of cycloaliphatic epoxides having a viscosity of less than 200 centipoise such as

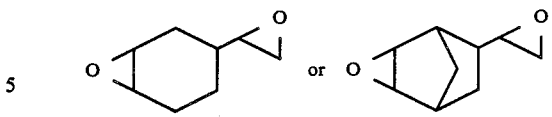

Further, such cycloaliphatic epoxides may be blended with the blends of cycloaliphatic epoxides and other epoxides described above. These epoxides are well known in the art and many are commercially available.

Suitable cycloaliphatic epoxide resins for purposes of this invention are those having an average of two or more epoxy groups per molecule. Illustrative of suitable cycloaliphatic epoxides are the following:

FORMULA 1

Diepoxides of cycloaliphatic esters of dicarboxylic acids having the formula:

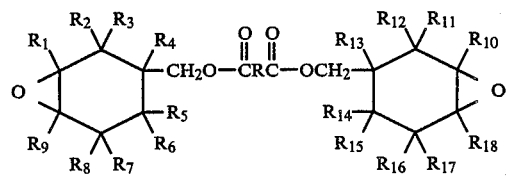

wherein $R_1$ through $R_{18}$, which can be the same or different, are hydrogen or alkyl radicals generally containing one to nine carbon atoms inclusive, and preferably containing one to three carbon atoms, inclusive, as for example methyl, ethyl, n-propyl, n-butyl, n-hexyl, 2-ethylhexyl, n-octyl, n-nonyl and the like; R is a valence bond or a divalent hydrocarbon radical generally containing one to twenty carbon atoms, inclusive, and preferably, containing four to six carbon atoms, inclusive, as for example, alkylene radicals, such as trimethylene, tetramethylene, pentamethylene, hexamethylene, 2-ethylhexamethylene, octamethylene, nonamethylene, hexadecamethylene, and the like; cycloaliphatic radicals, such as 1,4-cyclohexane, 1,3-cyclohexane, 1,2-cyclohexane, and the like.

Particularly desirable epoxides, falling within the scope of Formula I, are those wherein $R_1$ through $R_{18}$ are hydrogen and R is alkylene containing four to six carbon atoms.

Among specific diepoxides of cycloalphatic esters of dicarboxylic acids are the following:
bis(3,4-epoxycyclohexylmethyl)oxalate,
bis(3,4-epoxycyclohexylmethyl)adipate,
bis(3,4-epoxy-6-methylcyclohexylmethyl)adipate,
bis(3,4-epoxycyclohexylmethyl)pimelate, and the like.

Other suitable compounds are described in, for example, U.S. Pat. No. 2,750,395.

FORMULA II

A 3,4-epoxycyclohexylmethyl-3,4-epoxycyclohexane carboxylate having the formula:

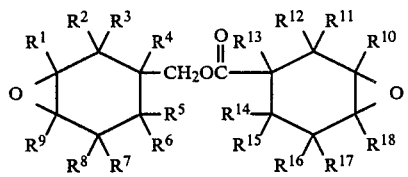

wherein R¹ through R¹⁸ which can be the same or different are as defined for $R_1$ through $R_{18}$ in Formula I. Particularly desirable compounds are those wherein R¹ through R¹⁸ are hydrogen.

Among specific compounds falling within the scope of Formula II are the following: 3,4-epoxycyclohexyl-methyl-3,4-epoxycyclohexane carboxylate; 3,4-epoxy-1-methylcyclohexylmethyl-3,4-epoxy-1-methylcyclohexane carboxylate; 6-methyl-3,4-epoxycyclohexyl-methyl-6-methyl-3,4-epoxycyclohexane carboxylate; 3,4-epoxy-3-methylcyclohexylmethyl-3,4-epoxy-3-methylcyclohexane carboxylate; 3,4-epoxy-5-methylcyclohexylmethyl-3,4-epoxy-5-methylcyclohexane carboxylate. Other suitable compounds are described in, for example, U.S. Pat. No. 2,890,194.

FORMULA III

Diepoxides having the formula:

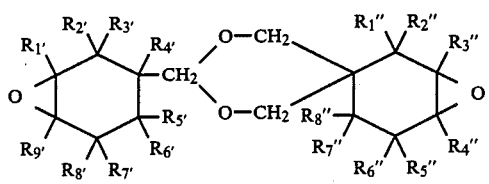

wherein the R single and double primes, which can be the same or different, are monovalent substituents such as hydrogen, halogen, i.e. chlorine, bromine, iodine or fluorine, or monovalent hydrocarbon radicals, or radicals as further defined in U.S. Pat. No. 3,318,822. Particularly, desirable compounds are those wherein all the R's are hydrogen.

Other suitable cycloaliphatic epoxides are the following:

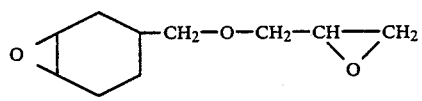

and the like.

The preferred cycloaliphatic epoxides are the following:

3,4-Epoxycyclohexylmethyl-3,4-Epoxycyclohexane carboxylate

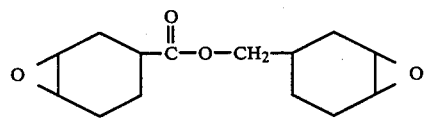

Bis(3,4-Epoxycyclohexylmethyl)adipate

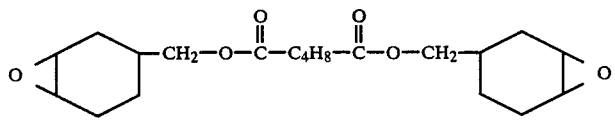

2-(3,4-Epoxycyclohexyl-5,5-spiro-3,4-epoxy)cyclohexane-meta-dioxane

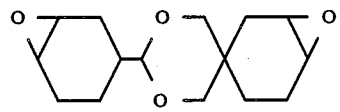

, or mixtures thereof.

Epoxides with six membered ring structures may also be used, such as diglycidyl esters of phthalic acid, partially hydrogenated phthalic acid or fully hydrogenated phthalic acid, the diglycidyl esters of hexahydrophthalic acids being preferred. A representative diglycidyl ester of phthalic acid is the following:

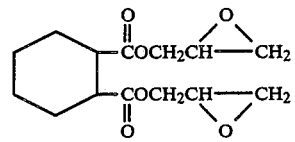

The glycidyl-type epoxides are preferably diglycidyl ethers of bisphenol A which are derived from bisphenol A and epichlorohydrin and have the following formula:

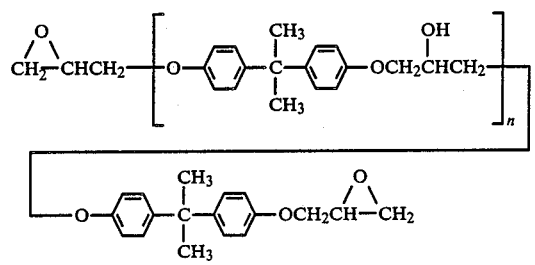

The cresol-novolac epoxy resins are multifunctional, solid polymers characterized by low ionic and hydrolyzable chlorine impurities, high chemical resistance, and thermal performance.

The epoxy phenol novolac resins are generally of the following formula:

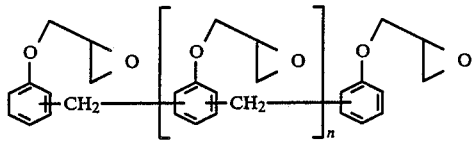

The polynuclear phenol-glycidyl etherderived resins are generally of the formula:

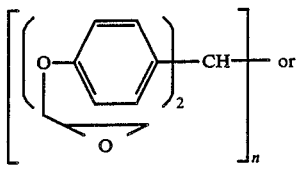

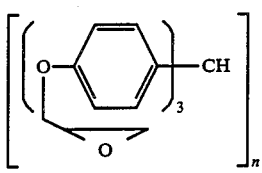

Among the aromatic and heterocyclic glycidyl amine resins which may be included herein are the following: tetraglycidylmethylenedianiline derived resins of the following formula:

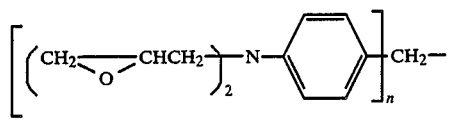

Triglycidyl-p-aminophenol derived resins, triazine based resins and hydantoin epoxy resins of the formula:

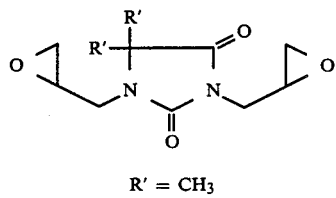

R' = CH₃

It is of course understood by those skilled in the art that when a photoinitiator is used, only minor amounts of basic organic nitrogen-containing epoxide compounds may be used so as not to interfere with the photocopolymerization reaction.

The concentration of the epoxides in the photocopolymerizable and blend compositions of this invention can range from about 1 to about 95 weight percent, preferably from 25 to 90 weight percent, and most preferably from 50 to 80 weight percent of the total weight of the coating composition depending upon the desired properties in the cured compositions. The ratio of the equivalent weight of epoxide to the total hydroxyl equivalent weight of the poly(active hydrogen) organic compound can range from about 120:1 to about 1:1, preferably from 110:1 to about 5:1, and most preferably from about 100:1 to about 10:1 depending upon the properties desired in the cured compositions. The preferred epoxides for use in the coating compositions of this invention are described in copending U.S. patent application Ser. No. 464,564, filed on an even date herewith, now abandoned.

The substituted cycloaliphatic monoepoxide used in the coating compositions of this invention is substituted with alkyl of 1 to 9 carbon atoms, halogen, oxygen, ether, ester or vinyl radicals. Preferably, the substituted cycloaliphatic monoepoxide is vinyl substituted cycloaliphatic monoepoxide and is preferably selected from one or more of the following:

(1) 4-vinyl cyclohexene monoepoxide having the formula

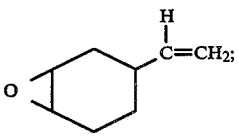

(2) vinyl norbornene monoepoxide having the formula

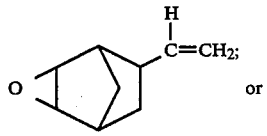

(3) limonene monoepoxide having the formula

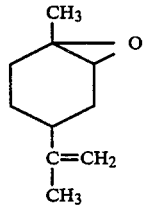

The substituted cycloaliphatic monoepoxide acts as a reactive diluent that cures into the final coating product, has a marked effect in lowering viscosity, is not volatilized during the radiation cure operation and does not retard the curing rate.

The substituted cycloaliphatic monoepoxide is used in the photocopolymerizable and blend compositions in amounts of from about 0.1 to about 95, preferably from about 1 to about 60, and most preferably, from about 3 to about 30 weight percent.

The poly(active hydrogen) organic compound that is blended with the substituted cycloaliphatic monoepoxide and the epoxide containing two or more epoxy groups to produce the coating compositions of this invention include any compatible organic compound containing two or more active hydrogen atoms per molecule. The poly(active hydrogen) organic compounds are well known the those skilled in the art and include, for example, oganic polyols and the like.

Substantially any of the organic polyols previously used in the art to make coating compositions can be used and are preferred as the poly(active hydrogen) organic compounds in this invention. Illustrative of the polyols useful in producing coating compositions in accordance with this invention are the polyether polyols such as polyhydroxyalkanes and polyoxyalkylene polyols, the acrylic and vinyl polyols, the polyester polyols, the polycaprolactone polyols, the polymer/polyols, and the like. Among the polyether polyols which can be employed are those selected from one or more of the following classes of compositions, alone or in admixture, known to those skilled in the art:

(a) Alkylene oxide adducts of polyhydroxyalkanes;
(b) Alkylene oxide adducts of non-reducing sugars and sugar derivatives;

(c) Alkylene oxide adducts of phosphorus and polyphosphorus acids;
(d) Alkylene oxide adducts of polyphenols;
(e) The polyols from natural oils such as castor oil, and the like.

Illustrative alkylene oxide adducts of polyhydroxylakanes include, among others, the alkylene oxide adducts of ethylene glycol, propylene glycol, 1,3-dihydroxypropane, 1,3-dihydroxybutane, 1,4-dihydroxybutane, 1,4-, 1,5-, and 1,6-dihydroxyhexane, 1,2-, 1,3- 1,4-, 1,6-, and 1,8-dihydroxyoctane, 1,10-dihydroxydecane, glycerol, 1,2,4-trihydroxybutane, 1,2,6-trihydroxyhexane, 1,1,1-trimethylolethane, 1,1,1-trimethylolpropane, pentaerythritol, polycaprolactone, xylitol, arabitol, sorbitol, mannitol, and the like. A preferred class of alkylene oxide adducts of polyhydroxyalkanes are the ethylene oxide, propylene oxide, butylene oxide, or mixtures thereof, adducts of trihydroxylalkanes.

A further class of polyether polyols which can be employed are the alkylene oxide adducts of the non-reducing sugars, wherein the alkylene oxides have from 2 to 4 carbon atoms. Among the non-reducing sugars and sugar derivatives contemplated are sucrose, alkyl glycosides such as methyl glucoside, ethyl glucoside, and the like, glycol glycosides such as ethylene glycol glucoside, propylene glycol glucoside, glycerol glucoside, 1,2,6-hexanetriol glucoside, and the like, as well as the alkylene oxide adducts of the alkyl glycosides as set forth in U.S. Pat. No. 3,073,788.

The alkylene oxide adducts of phosphorus and polyphosphorus acids are another useful class of polyether polyols. Ethylene oxide, 1,2-epoxypropane, the epoxybutanes, 3,-chloro-1,2-epoxypropane, and the like are preferred alkylene oxides. Phosphoric acid, phosphorus acid, the polyphosphoric acids such as tripolyphosphoric acid, the polymetaphosphoric acids, and the like are desirable for use in this connection.

A still further useful class of polyether polyols is the polyphenols, and preferably the alkylene oxide adducts thereof wherein the alkylene oxides have from 2 to 4 carbon atoms. Among the polyphenols which are contemplated are, for example, bisphenol A, bisphenol F, condensation products of phenol and formaldehyde, the novolac resins, condensation products of various phenolic compounds and acrolein; the simplest member of this class being the 1,1,3-tris(hydroxyphenyl) propanes, condensation products of various phenolic compounds and glyoxal, glutaraldehyde, and other dialdehydes, the simplest members of this class being the 1,1,2,2,-tetrakis(hydroxyphenol) ethanes, and the like.

The polyether polyols described hereinabove can have hydroxyl numbers which vary over a wide range. In general, the hydroxyl numbers of the above described polyols employed in this invention can range from about 15, and lower, to about 900, and higher. The hydroxyl number is defined as the number of milligrams of potassium hydroxide required for the complete neutralization of the fully phthalated derivative prepared from 1 gram of polyol. The hydroxyl number can also be defined by the equation:

$$OH = \frac{56.1 \times 1000 \times f}{m.w.}$$

where
OH = hydroxyl number of the polyol;
f = functionality, that is, average number of hydroxyl groups per molecule of polyol; and
m.w. = molecular weight of the polyol.

The polyether polyols described hereinabove can be prepared by conventional methods and are commercially available from a number of manufacturers.

The polycaprolactone polyols, alone or in admixture, that can be used to prepare the coating compositions of this invention include any of the known polycaprolactone polyols that are commercially available and that are fully described, for example, in U.S. Pat. No. 3,169,945. As described in this patent the polycaprolactone polyols are produced by the catalytic polymerization of an excess of a caprolactone and an organic polyfunctional initiator having as least two reactive hydrogen atoms. The organic functional initiators can be any polyhydroxyl compound as is shown in U.S. Pat. No. 3,169,645. Illustrative thereof are the diols such as ethylene glycol, diethylene glycol, triethylene glycol, 1,2-propylene glycol, dipropylene glycol, 1,3-propylene glycol, polyethylene glycol, polypropylene glycol, neopentyl glycol, 1,4-butanediol, poly(oxyethylene-oxypropylene) glycols, and similar polyalkylene glycols, either blocked, capped or heteric, containing up to about 40 or more alkyleneoxy units in the molecule, 3-methyl-1-5-pentanediol, cyclohexanediol, 4,4'-methylene-bis-cyclohexanol, 4,4'-isopropylidene bis-cyclohexanol, xylenediol, 2-(4-hydroxymethylphenyl) ethanol, 1,4-butanediol, 1,6-hexanediol and the like; triols such as glycerol, trimethylolpropane, 1,2,6-hexanetriol, triethanolamine, triisopropanolamine, and the like; tetrols such as erythritol, pentaerythritol, N,N,N',N',-tetrakis(2-hydroxyethyl)ethylene diamine, and the like.

When the organic functional initiator is reacted with the caprolactone a reaction occurs tht can be represented in its simplest form by the equation:

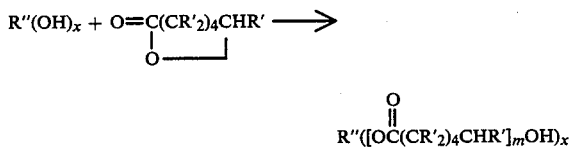

In this equation the organic functional initiator is the R"—(OH)$_x$ compound and the caprolactone is the $$\begin{matrix} O=C(CR'_2)_4CHR' \\ | \quad\quad\quad\quad | \\ O\rule{1cm}{0.4pt} \end{matrix}$$

compound; this can be epsilon caprolactone itself or a substituted caprolactone wherein R' is an alkyl, alkoxy, aryl, cycloalkyl, alkaryl or aralkyl group having up to twelve carbon atoms and wherein at least six of the R' groups are hydrogen atoms, as shown in U.S. Pat. No. 3,169,945. The polycaprolactone polyols that are used are shown by the formula on the right hand side of the equation; they can have an average molecular weight of from 200 to about 6,000. The preferred polycaprolactone polyol compounds are those having an average molecular weight of from about 290 to about 6,000, most preferably from about 290 to 3,000. The most preferred are the polycaprolactone diol compounds having an average molecular weight of from about 290 to about 1,500 and the polycaprolactone triol and tetrol compounds having an average molecular weight of from about 290 to about 3,000; these are most preferred because of their low viscosity properties. In the formula m is an integer representing the average number of repeating units needed to produce the compound having said molecular weights. The hydroxyl number of the polycaprolactone polyol can be from about 15 to 600, preferably from 200 to 500; and the polycaprolactone can have an average of from 2 to 8, preferably 2 to 4, hydroxyl groups.

Illustrative of polycaprolactone polyols that can be used in the coating compositions of this invention, one can mention the reaction products of a polyhydroxyl compound having an average from 2 to 6 hydroxyl groups with caprolactone. The manner in which these type polycaprolactone polyols is produced is shown in U.S. Pat. No. 3,169,645 and many such compositions are commercially available. In the following table there are listed illustrative polycaprolactone polyols. The first column lists the organic functional initiator that is reacted with the caprolactone and the average molecular weight of the polycaprolactone polyol is shown in the second column. Knowing the molecular weights of the initiator and of the polycaprolactone polyol one can readily determine the average number of molecules of caprolactone (CPL Units) that reacted to produce the compounds; this figure is shown in the third column.

POLYCAPROLACTONE POLYOLS

| Initiator | Average MW of polyol | Average No. of CPL units in molecules |
|---|---|---|
| 1 Ethylene glycol | 290 | 2 |
| 2 Ethylene glycol | 803 | 6.5 |
| 3 Ethylene glycol | 2,114 | 18 |
| 4 Propylene glycol | 874 | 7 |
| 5 Octylene glycol | 602 | 4 |
| 6 Decalene glycol | 801 | 5.5 |
| 7 Diethylene glycol | 527 | 3.7 |
| 8 Diethylene glycol | 847 | 6.5 |
| 9 Diethylene glycol | 1,246 | 10 |
| 10 Diethylene glycol | 1,998 | 16.6 |
| 11 Diethylene glycol | 3,526 | 30 |
| 12 Triethylene glycol | 754 | 5.3 |
| 13 Polyethylene glycol(MW 200)* | 713 | 4.5 |
| 14 Polyethylene glycol(MW 600)* | 1,398 | 7 |
| 15 Polyethylene glycol(MW 1500)* | 2,868 | 12 |
| 16 1,2-Propylene glycol | 646 | 5 |
| 17 1,3-Propylene glycol | 988 | 8 |
| 18 Dipropylene glycol | 476 | 3 |
| 19 Polypropylene glycol(MW 425)* | 835 | 3.6 |
| 20 Polypropylene glycol(MW 1000)* | 1,684 | 6 |
| 21 Polypropylene glycol(MW 2000)* | 2,456 | 4 |
| 22 Hexylene glycol | 916 | 7 |
| 23 2-Ethyl-1,3-hexanediol | 602 | 4 |
| 24 1,5-Pentanediol | 446 | 3 |
| 25 1,4-Cyclohexanediol | 629 | 4.5 |
| 26 1,3-Bis(hydroxyethyl)-benzene | 736 | 5 |
| 27 Glycerol | 548 | 4 |
| 28 1,2,6-Hexanetriol | 476 | 3 |
| 29 Trimethylolpropane | 590 | 4 |
| 30 Trimethylolpropane | 750 | 5.4 |
| 31 Trimethylolpropane | 1,103 | 8.5 |
| 32 Triethanolamine | 890 | 6.5 |
| 33 Erythritol | 920 | 7 |
| 34 Pentaerythritol | 1,219 | 9.5 |
| 35 1,4-Butanediol | 546 | 4 |
| 36 Neopentyl Glycol | 674 | 5 |

*Average molecular weight of glycol.

The structures of the compounds in the above tabulation are obvious to one skilled in the art based on the information given. The structure of compound No. 7 is:

wherein the variable r is an integer, the sum of r=r has an average value of 3.7 and the average molecular weight is 527. The structure of compound No. 20 is:

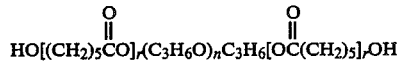

wherein the sum of r=r has an average value of 6 and the average molecular weight is 1,684. This explanation makes explicit the structural formulas of compounds 1 to 34 set forth above.

Polycaprolactone hexols suitable for use in the present invention can be prepared by the catalytic polymerization of an excess of polycaprolactone polyols and a cycloaliphatic epoxide. Illustrative polycaprolactone polyols useful in the preparation of polycaprolactone hexols include polycaprolactone diols, polycaprolactone triols and the like including mixtures thereof. Many of these polycaprolactone polyols are commercially available from Union Carbide Corporation. Cycloaliphatic epoxides suitable for use in preparing the polycaprolactone hexols include 3,4-epoxycyclohexylmethyl-3,4-epoxycyclohexane carboxylate, bis (3,4-epoxycyclohexylmethyl) adipate, vinyl cyclohexane dioxide and the like. Many of thise cycloaliphatic epoxides are commercially available from Union Carbide Coroporation. A suitable polymerization catalyst is diethylammonium triflate which is commercially available from the 3M Company as FC-520.

A preferred method for preparation of the polycaprolactone hexols comprises adding one or more polycarpolactone triols to a reactor, heating the polycaprolactone triols to a temperature of about 100° C. and adding the catalyst using a nitrogen sparge as soon as the polycaprolactone triols are molten. The polycaprolactone triols and catalyst mixture is then heated to a temperature of from about 150° C. to about 200° C. and a cycloaliphatic epoxide is added to the mixture. The reaction is carried out for about one hour to about three hours or until the oxirane content has been reduced to almost a nil value. A modification of this process can involve initially adding all of the ingredients into the reactor. A further modification of this method can involve a vacuum treatment of from 10 to 30 minutes after the catalyst addition and/or the use of a vacuum during the heating of the polycaprolatone triols to a molten state. Preferred polycaprolatone hexols suitable as ingredients in the coating compositions of this invention have an average molecular weight of from about 600 to about 1500.

Although not specifically mentioned above, it is appreciated that other lactone based polyols can be used in the coating compositions of this invention. Illustrative of other lactone based polyols include those derived from beta-propiolactone, delta-valerolactone, zeta-enantholactone and the like including derivatives thereof such as gamma-methyl-delta-valerolactone and the like.

The polymer/polyols that can be used to prepare the coating compositions of this invention are known materials. Such polymer/polyols can be produced by polymerizing one or more ethylenically unsaturated monomers dissolved or dispersed in a base polyol in the presence of a free radical catalyst. The production of polymer/polyols is more fully described in U.S. Patent Reissue No. 28,715, U.S. Patent Reissue No. 29,118, U.S. Pat. No. 3,652,639, U.S. Patent Reissue 29,014, U.S. Pat. No. 3,950,317, U.S. Pat. No. 4,208,314, U.S. Pat. No. 4,104,236, U.S. Pat. No. 4,172,825 and U.S. Pat. No. 4,198,488.

While poly(oxypropylene) polyols are preferred, substantially any of the polyols previously used in the art to make polymer/polyols can be used as the base polyol. Illustrative of the base polyols useful in producing polymer/polyol compositions are the polyether polyols such as polyhydroxyalkanes and polyoxyalkylene polyols, or the like. Among the base polyols which can be employed are those selected from one or more of the following classes of compositions, alone or in admixture, known to those skilled in the art and described more fully hereinabove:

(a) Alkylene oxide adducts of polyhydroxyalkanes;
(b) Alkylene oxide adducts of non-reducing sugars and sugar derivatives;
(c) Alkylene oxide adducts of phosphorus and polyphosphorus acids;
(d) Alkylene oxide adducts thereof of polyphenols;
(e) The polyols from natural oils such as castor oil, and the like.

The most preferred base polyols employed in the polymer/polyols which are useful as ingredients in the coating compositions of this invention include the poly(oxypropylene) polyols. It should be appreciated that a blend or mixture of more than one base polyol can be utilized, if desired, to form the polymer/polyol.

Conceptually, the monomers used in preparing the polymer/polyols can comprise any ethylenically unsaturated monomer or monomers. A variety of monomers are disclosed in the patents relating to polymer/polyols previously referred to. The selection of the monomer or monomers used will depend on considerations such as the relative cost of the monomers and the product characteristics required for the intended application.

The preferred monomer and monomer mixture used to make the polymer portion of the polymer/polyols is acrylonitrile and a mixture of acrylonitrile and styrene respectively. The relative weight proportions of acrylonitrile to styrene can range from about 80:20 to about 20:80. It may be desirable in some applications to utilize, with acrylonitrile, a comonomer other than styrene. Representative examples of suitable comonomers include methyl methacrylate, vinyl chloride and vinylidene chloride.

The polymer and polyol content of the polymer/polyols can vary within wide limits, depending upon the requirements of the anticipated end use application. In general, the polymer content will vary from about 10 to about 50 percent, based upon the weight of the polymer/polyol. The polyol content of the polymer/polyols varies from about 50 to about 90 percent, based upon the weight of the polymer/polyol.

The polymer/polyols may, if desired, be blended with other conventional polyols described hereinabove to reduce the polymer content to the level desirable for the particular end use application. Blends in which the resulting polymer content is as low as 4 percent of the total weight of the blend or even less may be useful in the coating compositions of this invention.

The most preferred classes of polyols employed in the coating compositions of this invention are the polycaprolatone polyols such as TONE-0200 and TONE-0305 commercially available from Union Carbide Corportion, the dihydroxyl functional polytetramethylene oxide polyols such as Polymeg 650, 1000 and 2000 commercially available from Quaker Oats Company, the polymer/polyols such as NIAX Polymer Polyol 31-23 and 34-28 commercially available from Union Carbide Corporation, and of course the ethylene oxide and propylene oxide adducts including ethylene glycol, diethylene glycol, the poly(oxyethylene) glycols, the poly(oxypropylene) glycols, triols and higher functionality polyols such as LHT-67, LHT-112, and LG-56 commercially available from Union Carbide Corporation. A preferred alkylene oxide derived polyol suitable for use in the coating compositions of this invention has the following formula:

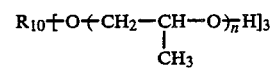

wherein $R_{10}$ is alkane of 3 to 10 carbon atoms, preferably 3 carbon atoms, and n is an integer of from about 10 to about 25. These polyols also include poly(oxypropylene-oxyethylene) polyols; however, desirably, the oxyethylene content should comprise less than 80 percent of the total and preferably less than 60 percent. The ethylene oxide when used can be incorporated in any fashion along the polymer chain. Stated another way, the ethylene oxide can be incorporated either in internal blocks, as terminal blocks, such as the propylene oxide polyols capped with ethylene oxide, i.e., NIAX Polyol 11-27 and 11-34 and E-474, commercially available from Union Carbide Corporation, or may be randomly distributed along the polymer chain. As is well known in the art, the polyols that are most preferred herein contain varying small amounts of unsaturation. Unsaturation in itself does not affect in any adverse way the formation of the coating compositions in accordance with the present invention.

Other preferred representative examples of organic polyols that may be employed in the coating compositions of this invention include copolymers of hydroxypropyl and hydroxyethyl acrylates and methacrylates with other free radical-polymerizable monomers such as acrylate esters, vinyl halides, vinyl acetate or styrene; copolymers containing pendent hydroxy groups formed by hydrolysis or partial hydrolysis or vinyl acetate copolymers, polyvinylacetal resins containing pendent hydroxyl groups; modified cellulose polymers such as hydroxyethylated and hydroxypropylated cellulose; hydroxy terminated polyesters and hydroxy terminated polyalkadienes. The polyester polyols are the reaction products of polyfunctional organic carboxylic acids and polyhydric alcohols and include, for example, poly(hexamethylene adipate), poly(ethylene adipate), poly(butylene adipate) and the like. Many of these organic polyols can be prepared by conventional methods and are commercially available from a number of manufacturers such as polyvinylacetal resins commercially available from Monsanto Chemical Company as Butvar B-72A, B-73, B-76, B-90 and B-98 and as Formvar 7/70, 12/85, 7/95S, 7/95E, 15/95S and 15/95E; an aliphatic polyester diol commercially available from Rohm and Haas as Paraplex U-148; saturated polyester polyols commercially available from Mobay Chemical Company as Multron R-2, R-12A, R-16, R-18, R-38, R-68, and R-74; a hydroxypropylated cellulose having an equivalent weight of approximately 100 commercially available from Hercules, Inc. as Klucel E; and a cellulose acetate butyrate ester having a hydroxyl equivalent weight of approximately 400 commercially available from Eastman Kodak as Alcohol Soluble Butyrate.

The poly(active hydrogen) organic compounds utilized in the coating compositions of this invention can be mixtures or blends of organic polyols. For example, when utilizing a polycaprolactone polyol, it may be desirable to mix or blend one or more of a propyolene oxide polyol, a propylene oxide polyol capped with ethylene oxide, a polytetramethylene oxide polyol or a polymer/polyol therewith. Other mixtures or blends may similarly be used if desired. The concentration of the organic polyols in the photocopolymerizable and blend compositions of this invention can range from about 1 to about 60 weight percent, preferably from 5 to 40 percent, and most preferably from 10 to 30 weight percent of the total weight of the coating composition. The ratio of the equivalent weight of epoxide to the total hydroxyl equivalent weight or organic polyol in the coating compositions of this invention can range from about 120:1 to 1:1, preferably from 110:1 to 2:1 and most preferably from 100:1 to 3:1 depending upon the equivalent weight of the polyol and the properties desired in the final coating composition.

the blend compositions of this invention comprise an epoxide containing two or more epoxy groups, a poly(active hydrogen) organic compound and a substituted cycloaliphatic monoepoxide. A preferred blend composition of this invention comprises from about 40 to about 70 weight percent of 3,4-epoxycyclohexylmethyl-3,4-epoxy- cyclohexane carboxylate, from about 1 to about 40 weight percent of a polycaprolactone triol and from about 5 to about 65 weight percent of 4-vinyl cyclohexene monoepoxide. Another preferred blend composition comprises from about 55 to about 85 weight percent of 3,4-epoxycyclohexylmethyl-3,4- epoxycyclohexane carboxylate, from about 10 to about 40 weight percent of a mixture of a polycaprolactone triol and at least one propylene oxide polyol, e.g., a mixture of TONE 0305, LHT-67 and LHT-112, and from about 5 to about 30 weight percent of 4-vinyl cyclohexene monoepoxide.

The photoinitiator suitable for use in the coating compositions of this invention may be any one of the well known photoinitiators such as described in, for example, U.S. Pat. Nos. 4,231,951; 4,256,828; 4,138,255 and 4,058,401, which patents are incorporated herein by reference. Preferred photoinitiators alone or in admixture include triarylsulfonium complex salts as described in U.S. Pat. No. 4,231,951; aromatic sulfonium or iodonium salts of halogen-containing complex ions as described in U.S. Pat. No. 4,256,828; aromatic onium salts of Group VIa elements as described in U.S. Pat. Nos. 4,058,401 and 4,138,255; aromatic onium salts of Group Va elements as described in U.S. Pat. No. 4,069,055. Such salts are commercially available as FC-508 and FC-509 (available from Minnesota Mining and Manufacturing Company), and as UVE-1014 (available from General Electric Company). Other preferred photoinitiators for use in the coating compositions of this invention are described more fully in copending U.S. patent application Ser. No. 464,570, filed on an even date herewith. The photoinitiators are used in conventional amounts such as from about 0.1 to 30 parts by weight per 100 parts by weight of the combination of cycloaliphatic epoxide and the poly(active hydrogen) organic compound.

The coating compositions may preferably include additives in conventional quantities such as oils, particularly silicone oil, surfactants such as silicone-alkylene oxide copolymers, e.g., L-5410 commercially available from Union Carbide Corporation, silicone oil containing aliphatic epoxide groups, fluorocarbon surfactants such as FC-171 commercially available from the 3M Company and FC-430 also commercially available from the 3M Company; low molecular weight alcohols such as RJ-100 commercially available from Monsanto Chemical Company; cellosolves, such as butyl CELLOSOLVE commercially available from Union Carbide Corporation; carbitols, such as butyl CARBITOL; diethyleneglycol; low molecular weight hydroxyl-containing vinyl polymers such as UCAR Solution Vinyl VYES commercially available from Union Carbide Corporation; glycidyl ether monomers of the formula:

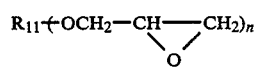

wherein $R_{11}$ is alkyl or aryl and n is an integer of 1 to 6. Examples are glycidyl ethers of polydydric phenols obtained by reacting a polyhydric phenol with an excess of chlorohydrin such as epichlorohydrin. Further examples of this type are described in, for example, U.S. Pat. No. 3,018,262; alpha olefin epoxides; epoxy novolaks, and the like. If desired, one may also include in the coating compositions various conventional non-basic fillers (e.g., silica, talc, glass beads or bubbles, clays, powdered metal such as aluminum, zinc oxide, etc.) up to about 50% by volume or more, viscosity modifiers, rubbers, tackifying agents, pigments, and so forth. The particular additives or fillers selected are of no consequence to the basic invention.

In preparing the coating compositions, the ingredients are mixed by conventional procedures used in the production of inks, paints and coating compositions. These procedures are so well known to those skilled in the art that they do not require further discussion here. However, it should be noted that when the photoinitiator is incorporated into the coating compositions, it is necessary that the curable coating formulation be mixed or blended under "safe light" such as a yellow light source to obviate or minimize photocopolymerization. The coating compositions can also contain an organic solvent as an optional component. Any of the conventional solvents used in the coatings industry can be used at a concentration preferably below 30 weight percent of the total weight of the coating composition. Suitable solvents are acetone, methylene chloride and any solvent that does not react appreciably with the substituted cycloaliphatic monoepoxide, the epoxide containing two or more epoxy groups and the photoinitiator. While larger amounts of solvent could conceivably be used, the use of larger amounts would negate the benefits of radiation curable coating which are considered to be essentially 100% solids coating systems. The solvents are generally added in the small amounts indicated to improve flowability during application of the coating composition to the substrate.

The curable coating compositions of this invention are applied to a suitable surface or substrate by conventional means such as roll coating or spray. Curing or photopolymerization of the coating compositions occurs on exposure of the compositions to any source of radiation emitting actinic radiation at a wavelength within the ultraviolet and visible spectral regions. Suitable sources of radiation include mercury, xenon, carbon arc and tungsten filament lamps, sunlight, etc. Exposures may be from less than about 1 second to 10 minutes or more depending upon the amounts of particular polymerizable materials and photoinitiators being utilized and depending upon the radiation source and distance from the source and the thickness of the coating to be cured. The compositions may also be polymerized by exposure to electron beam irradiation. Generally speaking the dosage necessary is from less than 1 megarad to 100 megarad or more. Generally speaking the rate of polymerization increases with increasing amounts of photoinitiator at a given light exposure or irradiation. The rate of polymerization also increases with increasing light intensity or electron dosage.

The curing or photopolymerization of the coating compositions is a triggered reaction. Once the degradation of the photointiator to a cationic catalyst has begun by exposure to a radiation source, the curing or photopolymerization reaction proceeds and will continue after the radiation source is removed. The use of thermal energy during or after exposure to a radiation source, i.e., post cure thermally, will generally accelerate the curing reaction, and even a moderate increase in temperature may greatly accelerate cure rate.

The photocopolymerizable compositions of this invention can be useful as automotive finishes, can finishes, appliance finishes, business machine finishes, coil coating, house siding finishes, general metal finishes and the like. The compositions can also be used as adhesives, printing inks, casting and molding compounds, potting and encapsulating compounds, caulking and sealing compounds, impregnating and coating compounds and the like. The photocopolymerizable compositions are particularly suitable in a variety of applications in the fields of protective coatings and graphic arts due to their superior impact resistance and abrasion-resistance and adhesion to rigid, resilient and flexible substrates such as metal, plastic, rubber, glass, paper, wood, and ceramics.

The coating compositions were evaluated according to the following procedures:

Solvent Resistance (Double Acetone Rubs): a measure of the resistance of the cured film to attack by acetone in which a film coating surface was rubbed with an acetone soaked cheesecloth back and forth with hand pressure. A rub back and forth with hand pressure over the film coating surface with the acetone soaked cheesecloth was designated as one "double acetone rub". The effect that a certain number of double acetone rubs had on the film coating surface was reported by a number in parenthesis following the number of double acetone rubs. The rating system for evaluating acetone resistance for a given number of double acetone rubs was as follows:

NUMBER IN PARENTHESIS AFTER NUMBER OF RUBS (1) No change in coating appearance.
(2) Scratched surface.
(3) Dulled, marred, some coating removed.
(4) Breaks in coating appearance.
(5) About one-half of the coating removed.

Pencil Hardness: pencil leads of increasing hardness values were forced against the film coating surface in a precisely defined manner as described in ASTM-D-3363-74 until one pencil lead marred the surface of the film coating. The surface hardness was considered as the hardest pencil grade which just failed to mar the film coating surface. The pencil leads in order of softest to hardest were reported as follows: 6B, 5B, 4B, 3B, 2B, B, HB, F, H, 2H, 3H, 4H, 5H, 6H, 7H, 8H, and 9H.

Crosshatch Adhesion: a lattice pattern with ten cuts in each direction was made in the coating film to the substrate and pressure-sensitive adhesive tape was applied over the lattice pattern and then removed. The adhesion was evaluated by comparison with descriptions and illustrations as more fully detailed in ASTM D 3359-78.

Forward Impact Resistance (Gardner Impact): a measure of the ability of a cured film coating to resist rupture from a falling weight. A Gardner Impact Tester Model IG-1120 using an eight pound dart was used to test film coatings cast and cured on steel panels. The dart was raised to a given height in inches and dropped onto the coated side of the coated steel panel. The inches times pounds, designated inch-pounds, absorbed by the film without rupturing was recorded as the films forward impact resistance.

Reverse Impact Resistance (Gardner Impact): a measure of the ability of a cured film coating to resist rupture from a falling weight. A Gardner Impact Tester Model IG-1120 using an eight pound dart was used to test film coatings cast and cured on steel panels. The dart was raised to a given height in inches and dropped onto the uncoated side of the coated steel panel. The inches times pounds, designated inch-pounds, absorbed by the film without rupturing was recorded as the films reverse impact resistance.

Moisture Resistance: the cured film coating was immersed in water for a specified period of time and at a specified temperature. After removal from the water, the hydrolytic resistance of the cured film coating was determined by the pencil hardness test and the crosshatch adhesion test described hereinabove. Results obtained were compared with the results of identical tests performed on cured film coatings not immersed in water to determine moisture resistance.

The following examples are illustrative of the present invention and are not intended as a limitation upon the scope thereof. As used in the examples appearing hereinafter, the following designations, terms and abbreviations have the indicated meanings:

| | |
|---|---|
| cps | centipoise |
| in/lbs. | inch/pounds |
| °C. | Centigrade degree |
| °F. | Fahrenheit degree |
| Hr. | hour |
| fpm | feet per minute |
| Temp. | temperature |
| Numbered Examples | examples which illustrate this invention. |
| Lettered Examples | comparative examples which do not illustrate this invention. |
| Epoxy/OH Eq. Wt. Ratio | The ratio of the equivalent weight of epoxide to the total hydroxyl equivalent weight of polyol. |
| Epoxide I | 3,4-Epoxycyclohexylmethyl-3,4-epoxycyclohexane carboxylate commercially available from Union Carbide Corporation as ERL-4221. |
| Epoxide II | Bis(3,4-epoxycyclohexylmethyl) adipate commercially available |

| | |
|---|---|
| Polyol I | from Union Carbide Corporation as ERL-4299. A polycaprolactone diol having an average molecular weight of 530, an average hydroxyl number of 212 and commercially available from Union Carbide Corporation as TONE-0200. |
| Polyol II | A polycaprolactone triol having an average molecular weight of 540, an average hydroxyl number of 310 and commercially available from Union Carbide Corporation as TONE-0305. |
| Polyol III | A propylene oxide polyol having an average equivalent weight of 837, an average hydroxyl number of 67 and commercially available from Union Carbide Corporation as LHT-67. |
| Polyol IV | A propylene oxide polyol having an average equivalent weight of 501, an average hydroxyl number of 112 and commercially available from Union Carbide Corporation as LHT-112. |
| Polyol V | A propylene oxide polyol having an average equivalent weight of 974, an average hydroxyl number of 58 and commercially available from Union Carbide Corporation as LG-56. |
| Polyol VI | A propylene oxide polyol capped with ethylene oxide having an average equivalent weight of 1603, an average hydroxyl number of 35 and commercially available from Union Carbide Corporation as NIAX Polyol 11-34. |
| Polyol VII | A propylene oxide polyol capped with ethylene oxide having an average equivalent weight of 2004, an average hydroxyl number of 28 and commercially available from Union Carbide Corporation as E-474. |
| Polyol VIII | A propylene oxide polyol capped with ethylene oxide having an average equivalent weight of 2078, an average hydroxyl number of 27 and commercially available from Union Carbide Corporation as NIAX Polyol 11-27. |
| Polyol IX | A dihydroxy functional polytetramethylene oxide polyol having an average molecular weight of 650, an average hydroxyl number of 160–187 and commercially available from Quaker Oats Company as Polymeg 650. |
| Polyol X | A dihydroxy functional polytetramethylene oxide polyol having an average molecular weight of 1000, an average hydroxyl number of 107–118 and commercially available from Quaker Oats Company as Polymeg 1000. |
| Polyol XI | A dihydroxy functional polytetramethylene oxide polyol having an average molecular weight of 2000, an average hydroxyl number of 53–59 and commercially available from Quaker Oats Company as Polymeg 2000. |
| Polymer/Polyol I | A polymer/polyol based on a propylene oxide polyol that contains 10 percent polyacrylonitrile in a dispersed solid phase; having an average equivalent weight of 2440, an average hydroxyl number of 23 and commercially available from Union Carbide Corporation as NIAX Polymer Polyol 31-23. |
| Polymer/Polyol II | A polymer/polyol based on a propylene oxide polyol that contains 21 percent of a styrene/acrylonitrile copolymer in a dispersed solid phase; having an average equivalent weight of 2004, an average hydroxyl number of 28 and commercially available from Union Carbide Corporation as NIAX Polymer/Polyol 34-28. |
| Reactive Diluent I | 4-Vinyl cyclohexene monoepoxide. |
| Photoinitiator I | A solution of a triarylsulfonium hexafluorophosphate having a specific gravity of 1.33 at 23° C., and a Brookfield viscosity of 40,000–60,000 centipoise (#4 spindle at 6 rpm, 23° C.) and commercially available from the 3M Company as FC-508. |
| Photoinitiator II | A solution of a triarylsulfonium hexafluoroantimony salt having a specific gravity of 1.39, a Brookfield viscosity of 74 centipoise at 25° C. and commercially available from General Electric Company as UVE-1014. |
| Surfactant I | A fluorinated alkyl ester of the nonionic type and commercially available from the 3M Company as FC-171. |
| Surfactant II | A fluorinated alkyl ester of the nonionic type and commercially available from the 3M Company as FC-430. |
| Surfactant III | A silicone composition having the following structure $$(CH_3)_3SiO\left[\begin{array}{c}CH_3\\|\\SiO\\|\\CH_3\end{array}\right]_{13}\left[\begin{array}{c}CH_3\\|\\SiO\\|\\(CH_2)_3(OC_2H_4)_7OH\end{array}\right]_{5.5}Si(CH_3)_3$$ and commercially available from Union Carbide Corporation as L-5410. |
| Copolymer I | A styrene/allyl alcohol copolymer having a number average molecular weight of 1600 and commercially available from Monsanto Chemical Company as RJ-100 |
| Copolymer II | Butyl CELLOSOLVE commercially available from Union Carbide Corporation |
| Copolymer III | A solution-polymerized hydroxyl-containing vinyl resin having a number average molecular weight of 4000–4500 and commercially available from Union Carbide Corporation |

-continued as UCAR Solution Vinyl VYES.

EXAMPLES 1 THROUGH 4 AND COMPARATIVE EXAMPLE A

Into brown glass bottles was added Epoxide I, Polyol II and Reactive Diluent I in the amounts specified for each example and comparative example in Table I below. The contents in the bottles were thoroughly blended until homogeneous by simple stirring at ambient temperature. The viscosity of the resulting blends prepared in each example and comparative example was then determined with a Brookfield viscometer at 25° C. (centipoise) and with a capillary viscometer at 25.4° C. (centistokes). The viscosity results are given in Table I.

TABLE I

| Example | A | 1 | 2 | 3 | 4 |
|---|---|---|---|---|---|
| Ingredients, grams | | | | | |
| Epoxide I | 45.0 | 45.0 | 47.25 | 42.75 | 47.5 |
| Polyol II | 5.0 | 5.0 | 5.25 | 4.75 | 5.0 |
| Reactive Diluent I | 0 | 50.0 | 47.5 | 52.5 | 47.5 |
| Properties | | | | | |
| Viscosity, centipoise | 610 | 14 | 16 | 18 | 31 |
| Viscosity, centistokes | — | 8.4 | 9.4 | 7.4 | — |

Table I shows that the viscosities of the blend formulations containing Reactive Diluent I, i.e., Examples 1 through 4, are significantly lower than the viscosity of Comparative Example A which does not contain Reactive Diluent I.

EXAMPLES 5 THROUGH 9 AND COMPARATIVE EXAMPLES B THROUGH F

Into brown glass bottles under a yellow light source was added Epoxide I, Polyol II, Reactive Diluent I, Photoinitiator I, and Surfactant II in the amounts specified for each example and comparative example in Table II below. The contents in the bottles were thoroughly blended until homogeneous by simple stirring at ambient temperature. The viscosity of the resulting blends prepared in each example and comparative example was then determined with a Brookfield viscometer at 24.5° C. (centipoise). The viscosity results are given in Table II.

TABLE II

| Example | B | 5 |
|---|---|---|
| Ingredients, grams | | |
| Epoxide I | 66.41 | 66.41 |
| Polyol II | 29.09 | 29.09 |
| Reactive Diluent I | 0 | 10.0 |
| Photoinitiator I | 4.0 | 4.0 |
| Surfactant II | 0.5 | 0.5 |
| Properties | | |
| Viscosity, Centipoise | 810 | 258 |

Table II shows that the viscosity of the blend formulation containing Reactive Diluent I, i.e., Example 5, is significantly lower than the viscosity of Comparative Example B which does not contain Reactive Diluent I.

The blended formulations were then applied to Bonderite 37(R) treated steel panels using a Number 20 wirewound rod and cured with one pass under a 100 watt per inch, medium pressure, mercury lamp ultraviolet light source at either 30 feet per minute or 60 feet per minute. One Bonderite 37(R) treated steel panel coated with the specified blended formulation was prepared for each example and comparative example. The cured coating on the Bonderite 37(R) treated steel panels of Comparative Examples C, D, E and F was prepared from the blended formulation of Comparative Example B. The cured coating on the Bonderite 37(R) treated steel panels of Examples 6, 7, 8 and 9 was prepared from the blended formulation of Example 5. The thickness of the coatings varied from about 0.8 mils to about 1.1 mils. Specifically designated cured coatings in Table III below were not post cured thermally and other specifically designated cured coatings in Table III were post cured thermally at 170° C. for 10 minutes before testing for the properties designated in Table III. The results of the testing are given in Table III.

TABLE III

| Example | C | D | 6 | 7 |
|---|---|---|---|---|
| Properties | | | | |
| Double Acetone Rubs | 100(2) | 100(1) | 100(1) | 100(2) |
| Pencil Hardness | 2H | 2H | H | H |
| % Crosshatch Adhesion | 100 | 100 | 100 | 100 |
| UV Light Source, fpm | 30 | 60 | 30 | 60 |
| Thermal Post Cure | No | No | No | No |
| Gardner Impact, in. lbs. | | | | |
| Forward | 300 | 275 | 175 | 250 |
| Reverse | 150 | 200 | 175 | 250 |
| Example | E | F | 8 | 9 |
| Properties | | | | |
| Double Acetone Rubs | 100(1) | 100(1) | 100(1) | 100(1) |
| Pencil Hardness | 2H | 2H | H | H |
| % Crosshatch Adhesion | 100 | 100 | 100 | 100 |
| UV Light Source, fpm | 30 | 60 | 30 | 60 |
| Thermal Post Cure | Yes | Yes | Yes | Yes |
| Gardner Impact, in. lbs. | | | | |
| Forward | >320 | 250 | >320 | >20 |
| Reverse | 175 | 175 | >320 | >320 |

Table III shows that the cured coatings prepared from both the blended formulation of Example 5 and Comparative Example B possess similar properties and are of high quality. However, the high viscosity of the blended formulation of Comparative Example B precludes the application thereof by conventional techniques such as roll coating or spray. The blended formulation of Example 5 having a significantly lower viscosity affords easy application thereof to a suitable substrate by conventional techniques such as roll coating and spray.

EXAMPLES 10 THROUGH 12 AND COMPARATIVE EXAMPLES G THROUGH I

In brown glass bottles under a yellow light source was added Epoxide I, Polyol IV, Reactive Diluent I, Photoinitiator I and Surfactant III in the amounts specified for each example and comparative example in Table IV below. The contents in the bottles were thoroughly blended until homogeneous by simple stirring at ambient temperature. The viscosity of the resulting blends prepared in each example and comparative example was then determined with a Brookfield viscometer at ambient temperature. The viscosity results are given in Table IV.

TABLE IV

| Example | G | 10 |
|---|---|---|
| Ingredients, grams | | |
| Epoxide I | 80.74 | 71.24 |
| Polyol IV | 14.76 | 14.76 |
| Reactive Diluent I | 0 | 9.50 |
| Photoinitiator I | 4.0 | 4.0 |
| Surfactant III | 0.5 | 0.5 |
| Properties | | |
| Viscosity, Centipoise | 484 | 180 |

Table IV shows that the viscosity of the blend formulation containing Reactive Diluent I, i.e., Example 10, is significantly lower than the viscosity of Comparative Example G which does not contain Reactive Diluent I.

The blended formulations were then applied to Bonderite 37$^{(R)}$ treted steel panels using a Number 20 wire-wound rod and cured with one pass under a 100 watt per inch, medium pressure, mercury lamp ultraviolet light source at 30 feet per minute. One Bonderite 37$^{(R)}$ treated steel panel coated with the specified blended formulation was prepared for each example and comparative example. The cured coating on the Bonderite 37$^{(R)}$ treated steel panels of Comparative Examples H and I was prepared from the blended formulation of Comparative Example G. The cured coating on the Bonderite 37$^{(R)}$ treated steel panels of Examples 11 and 12 was prepared from the blended formulation of Example 10. The thickness of the coatings varied from about 0.8 mils to about 1.1 mils. The cured coatings were slightly tacky immediately after ultraviolet irradiation but tack free when cooled to room temperature. Specifically designated cured coatings in Table V below were not post cured thermally and other specifically designated cured coatings in Table V were post cured thermally at 170° C. for 10 minutes before testing for the properties designated in Table V. The results of the testing are given in Table V.

TABLE V

| Example | H | I | 11 | 12 |
|---|---|---|---|---|
| Properties | | | | |
| Double Acetone Rubs | 20(5) | 45(4) | 70(4) | 100(1) |
| Pencil Hardness | HB | HB | H | 2H |
| % Crosshatch Adhesion | 100 | 100 | 100 | 100 |
| Thermal Post Cure | No | Yes | No | Yes |
| Gardner Impact, in. lbs. | | | | |
| Forward | 25 | 25 | >320 | >320 |
| Reverse | <5 | <5 | >320 | >320 |

Table V shows that the cured coatings prepared from the blend formulation of Example 10 containing Reactive Diluent I exhibit improved solvent resistance, hardness and impact resistance in comparison with the cured coatings prepared from the blend formulation of Comparative Example G containing no Reactive Diluent I.

EXAMPLES 13 THROUGH 21 AND COMPARATIVE EXAMPLES J THROUGH L

Into brown glass bottles under a yellow light source was added Epoxide I, Polyol V, Reactive Diluent I, Copolymer II, Photoinitiator I, Photoinitiator II, Surfactant I and Surfactant III in the amounts specified for each example and comparative example in Table VI below. The contents in the bottles were thoroughly blended until homogeneous by simple stirring at ambient temperature. The viscosity of the resulting blends prepared in each example and comparative example was then determined with a Brookfield viscometer at ambient temperature. The viscosity results are given in Table VI.

TABLE VI

| Example | J | 13 | 14 | 15 |
|---|---|---|---|---|
| Ingredients, grams | | | | |
| Epoxide I | 66.77 | 57.27 | 60.43 | 60.43 |
| Polyol V | 23.73 | 23.73 | 25.05 | 25.04 |
| Reactive Diluent I | 0 | 9.50 | 10.03 | 10.03 |
| Copolymer II | 5.0 | 5.0 | 0 | 0 |
| Photoinitiator I | 4.0 | 4.0 | 4.0 | 0 |
| Photoinitiator II | 0 | 0 | 0 | 4.0 |
| Surfactant I | 0.5 | 0 | 0 | 0 |
| Surfactant III | 0 | 0.5 | 0.5 | 0.5 |
| Properties | | | | |
| Viscosity, centipoise | 336 | 150 | 196 | 174 |

Table VI shows that the viscosity of the blend formulations containing Reactive Diluent I, i.e., Examples 13, 14 and 15, is significantly lower than the viscosity of Comparative Example J which does not contain Reactive Diluent I. The blend formulation of Example 13 containing Copolymer II shows a further lowering of the viscosity in comparison with the blend formulations of Examples 14 and 15 which do not contain Copolymer II.

The blended formulations were then applied to Bonderite 37$^{(R)}$ treated steel panels using a Number 20 wire-wound rod and cured with one pass under a 100 watt per inch, medium pressure, mercury lamp ultraviolet light source at 30 feet per minute. One Bonderite 37$^{(R)}$ treated steel panel coated with the specified blended formulation was prepared for each example and comparative example. The cured coating on the Bonderite 37$^{(R)}$ treated steel panels of Comparative Examples K and L was prepared from the blended formulation of Comparative Example J. The cured coating on the Bonderite 37$^{(R)}$ treated steel panels of Examples 16, 17 and 18 was prepared from the blended formulations of Examples 13, 14 and 15 respectively. The cured coating of the Bonderite 37$^{(R)}$ treated steel panels of Examples 19, 20 and 21 was prepared from the blended formulations of Examples 13, 14 and 15 respectively. The thickness of the coatings varied from about 0.8 mils to about 0.9 mils. The cured coatings were tack free immediately after ultraviolet light irradiation. Specifically designated cured coatings in Table VII below were not post cured thermally and other specifically designated cured coatings in Table VII were post cured thermally at 170° C. for 10 minutes before testing for the properties designated in Table VII. The results of the testing are given in Table VII.

TABLE VII

| Example | K | 16 | 17 | 18 |
|---|---|---|---|---|
| Properties | | | | |
| Double Acetone Rubs | 70(4) | 66(4) | 35(4) | 90(4) |
| Pencil Hardness | H | H | F | H |
| % Crosshatch Adhesion | 100 | 100 | 100 | 100 |
| Thermal Post Cure | No | No | No | No |
| Gardner Impact, in. lbs. | | | | |
| Forward | >320 | >320 | >320 | >320 |
| Reverse | >320 | >320 | >320 | >320 |

TABLE VII-continued

| Example | L | 19 | 20 | 21 |
|---|---|---|---|---|
| Properties | | | | |
| Double Acetone Rubs | 100(1) | 100(1) | 100(4) | 100(1) |
| Pencil Hardness | H | 2H | H | H |
| % Crosshatch Adhesion | 100 | 100 | 100 | 100 |
| Thermal Post Cure | Yes | Yes | Yes | Yes |
| Gardner Impact, in. lbs. | | | | |
| Forward | >320 | >320 | >320 | >320 |
| Reverse | >320 | >320 | >320 | >320 |

Table VII shows that the cured coatings prepared from both the blend formulations of Example 13, 14 and 15 and Comparative Example J possess similar properties and are of high quality. However, the high viscosity of the blended formulations of Comparative Example J precludes the applications thereof by conventional techniques such as roll coating or spray. The blended formulations of Examples 13, 14 and 15 having a significantly lower viscosity afford easy application thereof to a suitable substrate by conventional techniques such as roll coating and spray.

EXAMPLES 22 THROUGH 27

Into brown glass bottles under a yellow light source was added Epoxide I, Polyol II, Reactive Diluent I, Copolymer I, Photoinitiator II and Surfactant III in the amounts specified for each example in Table VIII below. The contents in the bottles were thoroughly blended by simple stirring at ambient temperature. All of the components were mutually soluble except for Copolymer I. The bottles were thereafter agitated for about 16 hours and then heated to 100° C. for 30 minutes. The bottles were agitated again for about 54 hours, after which time, Copolymer I was solubilized in the blend formulation. The viscosity of the resulting blends prepared in each example was then determined with a Brookfield viscometer at ambient temperature. The viscosity results are given in Table VIII.

TABLE VIII

| Example | 22 | 23 |
|---|---|---|
| Ingredients, grams | | |
| Epoxide I | 49.0 | 50.0 |
| Polyol II | 22.0 | 19.0 |
| Reactive Diluent I | 16.5 | 15.0 |
| Copolymer I | 8.0 | 11.5 |
| Photoinitiator II | 4.0 | 4.0 |
| Surfactant III | 0.5 | 0.5 |
| Properties | | |
| Viscosity, Centipoise | 238 | 350 |

The blended formulations were then applied to Bonderite 37(R) treated steel panels using a Number 20 wire-wound rod and cured with one pass under a 100 watt per inch, medium pressure, mercury lamp ultraviolet light source at 30 feet per minute. One Bonderite 37(R) treated steel panel coated with the specified blended formulation was prepared for each example. The cured coating on the Bonderite 37(R) treated steel panels of Examples 24 and 26 was prepared from the blended formulation of Example 22. The cured coating on the Bonderite 37(R) treated steel panels of Examples 25 and 27 was prepared from the blended formulation of Example 23. The thickness of the coatings varied from about 0.8 mils to about 0.9 mils. The cured coatings were tack free immediately after ultraviolet light irradiation. Specifically designated cured coatings in Table IX below were not post cured thermally and other specifically designated cured coatings in Table IX were post cured thermally at 170° C. for 10 minutes before testing for the properties designated in Table IX. The results of the testing are given in Table IX.

TABLE IX

| Example | 24 | 25 | 26 | 27 |
|---|---|---|---|---|
| Properties | | | | |
| Double Acetone Rubs | 60(4) | 60(4) | 100(2) | 100(1) |
| Pencil Hardness | 2H | 2H | 2H | 2H |
| % Crosshatch Adhesion | 100 | 100 | 100 | 100 |
| Thermal Post Cure | No | No | Yes | Yes |
| Gardner Impact, in. lbs. | | | | |
| Forward | 25 | 25 | 25 | 25 |
| Reverse | <5 | <5 | <5 | <5 |

Table IX shows the properties of cured coatings which were prepared from blend formulations containing Copolymer I.

EXAMPLES 28 THROUGH 45 AND COMPARATIVE EXAMPLES M THROUGH MM

Into brown glass bottles under a yellow light source was added Epoxide I, Polyol IX, Polyol X, Polyol XI, Reactive Diluent I, Photoinitiator I, and Surfactant III in the amounts specified for each example and comparative example in Table X below. The contents in the bottles were thoroughly blended until homogeneous by simple stirring at ambient temperature. The viscosity of the resulting blends prepared in each example and comparative example was then determined with a Brookfield viscometer at ambient temperature. The viscosity results are given in Table X.

TABLE X

| Example | M | N | O | P | Q |
|---|---|---|---|---|---|
| Ingredients, grams | | | | | |
| Epoxide I | 85.4 | 77.2 | 64.8 | 18.1 | 80.8 |
| Polyol IX | 10.1 | 18.3 | 30.7 | 0 | 0 |
| Polyol X | 0 | 0 | 0 | 10.4 | 14.7 |
| Polyol XI | 0 | 0 | 0 | 0 | 0 |
| Photoinitiator I | 4.0 | 4.0 | 4.0 | 4.0 | 4.0 |
| Surfactant III | 0.5 | 0.5 | 0.5 | 0.5 | 0.5 |
| Reactive Diluent I | 0 | 0 | 0 | 0 | 0 |
| Properties | | | | | |
| Epoxy/OH Eq. Wt. Ratio | 20 | 10 | 5 | 30 | 20 |
| Viscosity, centipoise | 484 | 422 | 364 | 586 | 548 |

| Example | R | S | T | U | 28 |
|---|---|---|---|---|---|
| Ingredients, grams | | | | | |
| Epoxide I | 70.8 | 80.8 | 76.8 | 70.0 | 77.28 |
| Polyol IX | 0 | 0 | 0 | 0 | 9.17 |
| Polyol X | 25.5 | 0 | 0 | 0 | 0 |
| Polyol XI | 0 | 14.7 | 18.7 | 25.5 | 0 |
| Photoinitiator I | 4.0 | 4.0 | 4.0 | 4.0 | 4.0 |
| Surfactant III | 0.5 | 0.5 | 0.5 | 0.5 | 0.5 |
| Reactive Diluent I | 0 | 0 | 0 | 0 | 9.05 |
| Properties | | | | | |
| Epoxy/OH Eq. Wt. Ratio | 10 | 40 | 30 | 20 | 20 |
| Viscosity, centipoise | 516 | 832 | 824 | 930 | 178 |

| Example | 29 | 30 | 31 | 32 | 33 |
|---|---|---|---|---|---|
| Ingredients, | | | | | |

TABLE X-continued

| grams | | | | | |
|---|---|---|---|---|---|
| Epoxide I | 58.63 | 77.07 | 63.33 | 73.11 | 63.33 |
| Polyol IX | 27.82 | 0 | 0 | 0 | 0 |
| Polyol X | 0 | 9.38 | 23.12 | 0 | 0 |
| Polyol XI | 0 | 0 | 0 | 13.74 | 23.12 |
| Photoinitiator I | 4.0 | 4.0 | 4.0 | 4.0 | 4.0 |
| Surfactant III | 0.5 | 0.5 | 0.5 | 0.5 | 0.5 |
| Reactive Diluent I | 9.05 | 9.05 | 9.05 | 9.05 | 9.05 |
| Properties | | | | | |
| Epoxy/OH Eq. Wt. Ratio | 5 | 30 | 10 | 40 | 20 |
| Viscosity, centipoise | 162 | 204 | 192 | 292 | 366 |

Table X shows that the viscosity of the blend formulations containing Reactive Diluent I, i.e., Examples 28 through 33, is significantly lower than the viscosity of Comparative Examples M through U which do not contain Reactive Diluent I.

The blended formulations were then applied to Bonderite 37$^{(R)}$ treated steel panels using a Number 20 wirewound rod and cured with one pass under a 100 watt per inch, medium pressure, mercury lamp ultraviolet light source at 30 feet per minute. One Bonderite 37$^{(R)}$ treated steel panel coated with the specified blended formulation was prepared for each example and comparative example. The cured coating on the Bonderite 37$^{(R)}$ treated steel panels of Comparative Examples V through DD was prepared from the blended formulation of Comparative Examples M through U respectively. The cured coating on the Bonderite 37$^{(R)}$ treated steel panels of Comparative Examples EE through MM was prepared from the blended formulation of Comparative Examples M through U respectively. The cured coating on the Bonderite 37$^{(R)}$ treated steel panels of Examples 34 through 39 was prepared from the blended formulation of Examples 28 through 33 respectively. The cured coating on the Bonderite 37$^{(R)}$ treated steel panels of Examples 40 through 45 was prepared from the blended formulation of Examples 28 through 33 respectively. The thickness of the coatings varied from about 0.8 mils to about 0.9 mils. The cured coatings were tack free immediately after ultraviolet light irradiation. Specifically designated cured coatings in Table XI below were not post cured thermally and were aged one day at ambient temperature before testing, and other specifically designated cured coatings in Table XI were post cured thermally at 170° C. for 10 minutes before testing for the properties designated in Table XI. The results of the testing are given in Table XI.

TABLE XI

| Example | V | W | X | Y | Z |
|---|---|---|---|---|---|
| Properties | | | | | |
| Double Acetone Rubs | 100(1) | 100(1) | 100(1) | 100(1) | 100(1) |
| Pencil Hardness | H | F | F | F | F |
| % Crosshatch Adhesion | 100 | 100 | 100 | 100 | 100 |
| Thermal Post Cure | No | No | No | No | No |
| Gardner Impact, in. lbs. | | | | | |
| Forward | 75 | >320 | >320 | >320 | >320 |
| Reverse | 75 | >320 | >320 | >320 | >320 |
| Moisture Resistance 48 Hr. Water Immersion at Room Temp. | | | | | |
| Pencil Hardness | HB | HB | F | HB | HB |
| % Crosshatch Adhesion | 25 | 15 | 15 | 25 | 10 |
| 3 Hr. Water Immersion at 130° F. | | | | | |
| Pencil Hardness | F | H | F | F | F |
| % Crosshatch Adhesion | 20 | 10 | 15 | 20 | 10 |

| Example | AA | BB | CC | DD | EE |
|---|---|---|---|---|---|
| Properties | | | | | |
| Double Acetone Rubs | 100(1) | 100(1) | 100(1) | 100(1) | 100(1) |
| Pencil Hardness | F | F | F | F | 2H |
| % Crosshatch Adhesion | 100 | 100 | 100 | 100 | 100 |
| Thermal Post Cure | No | No | No | No | Yes |
| Gardner Impact, in. lbs. | | | | | |
| Forward | >320 | >320 | >320 | >320 | 25 |
| Reverse | >320 | >320 | >320 | >320 | <5 |
| Moisture Resistance 48 Hr. Water Immersion at Room Temp. | | | | | |
| Pencil Hardness | F | HB | F | F | F |
| % Crosshatch Adhesion | 20 | 30 | 0 | 10 | 100 |
| 3 Hr. Water Immersion at 130° F. | | | | | |
| Pencil Hardness | F | H | H | F | H |
| % Crosshatch Adhesion | 15 | 10 | 25 | 30 | 100 |

| Example | FF | GG | HH | II | JJ |
|---|---|---|---|---|---|
| Properties | | | | | |
| Double Acetone Rubs | 100(1) | 100(1) | 100(1) | 100(1) | 100(1) |
| Pencil Hardness | H | H | 2H | 2H | H |
| % Crosshatch Adhesion | 100 | 100 | 100 | 100 | 100 |
| Thermal Post Cure | Yes | Yes | Yes | Yes | Yes |
| Gardner Impact, in. lbs. | | | | | |
| Forward | >320 | >320 | 25 | >320 | >320 |
| Reverse | >320 | >320 | <5 | >320 | >320 |
| Moisture Resistance 48 Hr. Water Immersion at Room Temp. | | | | | |
| Pencil Hardness | F | F | F | F | F |
| % Crosshatch Adhesion | 100 | 100 | 100 | 100 | 100 |
| 3 Hr. Water Immersion at 130° F. | | | | | |
| Pencil Hardness | H | H | H | H | H |
| % Crosshatch Adhesion | 100 | 100 | 100 | 99 | 95 |

| Example | KK | LL | MM | 34 | 35 |
|---|---|---|---|---|---|
| Properties | | | | | |
| Double Acetone Rubs | 100(1) | 100(1) | 100(1) | 90(4) | 100(1) |
| Pencil Hardness | H | H | H | F | F |

TABLE XI-continued

| | | | | | |
|---|---|---|---|---|---|
| % Crosshatch Adhesion | 100 | 100 | 100 | 100 | 100 |
| Thermal Post Cure | Yes | Yes | Yes | No | No |
| Gardner Impact, in. lbs. | | | | | |
| Forward | >320 | >320 | >320 | >320 | >320 |
| Reverse | >320 | >320 | >320 | >320 | >320 |
| Moisture Resistance 48 Hr. Water Immersion at Room Temp. | | | | | |
| Pencil Hardness | F | F | F | HB | HB |
| % Crosshatch Adhesion | 100 | 100 | 100 | 40 | 0 |
| 3 Hr. Water Immersion at 130° F. | | | | | |
| Pencil Hardness | H | H | H | F | F |
| % Crosshatch Adhesion | 100 | 100 | 100 | 5 | 5 |

| Example | 36 | 37 | 38 | 39 | 40 |
|---|---|---|---|---|---|
| Properties | | | | | |
| Double Acetone Rubs | 100(4) | 100(1) | 80(4) | 100(2) | 100(1) |
| Pencil Hardness | F | F | F | F | H |
| % Crosshatch Adhesion | 100 | 100 | 100 | 100 | 100 |
| Thermal Post Cure | No | No | No | No | Yes |
| Gardner Impact, in. lbs. | | | | | |
| Forward | >320 | >320 | >320 | >320 | 25 |
| Reverse | >320 | >320 | >320 | >320 | <5 |
| Moisture Resistance 8 Hr. Water Immersion at Room Temp. | | | | | |
| Pencil Hardness | F | F | F | F | F |
| % Crosshatch Adhesion | 20 | 5 | 50 | 0 | 100 |
| 3 Hr. Water Immersion at 130° F. | | | | | |
| Pencil Hardness | F | H | F | F | H |
| % Crosshatch Adhesion | 25 | 75 | 50 | 20 | 100 |

| Example | 41 | 42 | 43 | 44 | 45 |
|---|---|---|---|---|---|
| Properties | | | | | |
| Double Acetone Rubs | 100(1) | 100(1) | 100(1) | 100(3) | 100(1) |
| Pencil Hardness | H | H | F | F | F |
| % Crosshatch Adhesion | 100 | 100 | 100 | 100 | 100 |
| Thermal Post Cure | Yes | Yes | Yes | Yes | Yes |
| Gardner Impact, in. lbs. | | | | | |
| Forward | >320 | 25 | >320 | >320 | >320 |
| Reverse | >320 | <5 | >320 | >320 | >320 |
| Moisture Resistance 48 Hr. Water Immersion at Room Temp. | | | | | |
| Pencil Hardness | F | F | F | F | F |
| % Crosshatch Adhesion | 100 | 100 | 100 | 100 | 100 |
| 3 Hr. Water Immersion at 130° F. | | | | | |
| Pencil Hardness | H | H | H | H | H |
| % Crosshatch Adhesion | 100 | 100 | 100 | 100 | 100 |

Table XI shows the properties of cured coatings which were prepared from blend formulations containing dihydroxy functional polytetramethylene oxide polyols, i.e., Polyol IX, Polyol X and Polyol XI.

EXAMPLES 46 THROUGH 63 AND COMPARATIVE EXAMPLES NN THROUGH OOOO

Into brown glass bottles under a yellow light source was added Epoxide I, Polyol VIII, Polyol VII, Polyol VI, Reactive Diluent I, Photoinitiator I, Photoinitiator II, and Surfactant III in the amounts specified for each example and comparative example in Table XII below. The contents in the bottles were thoroughly blended until homogeneous by simple stirring at ambient temperature. The viscosity of the resulting blends prepared in each example and comparative example was then determined with a Brookfield viscometer at 31° C. for Comparative Examples NN through SS and Examples 46 and 47, at 23.9° C. for Comparative Examples TT though YY and Examples 48 and 49, and at 28.9° C. for Comparative Examples ZZ through EEE and Examples 50 and 51. The viscosity results are given in Table XII.

TABLE XII

| Example | NN | OO | PP | QQ | RR |
|---|---|---|---|---|---|
| Ingredients, grams | | | | | |
| Epoxide I | 79.7 | 73.6 | 69.6 | 63.8 | 73.6 |
| Polyol VI | 0 | 0 | 0 | 0 | 0 |
| Polyol VII | 0 | 0 | 0 | 0 | 0 |
| Polyol VIII | 15.8 | 21.9 | 25.9 | 31.6 | 21.9 |
| Reactive Diluent I | 0 | 0 | 0 | 0 | 0 |
| Photo-Initiator I | 4.0 | 4.0 | 4.0 | 4.0 | 0 |
| Photo-Initiator II | 0 | 0 | 0 | 0 | 4.0 |
| Surfactant III | 0.5 | 0.5 | 0.5 | 0.5 | 0.5 |
| Properties | | | | | |
| Epoxy/OH Eq. Wt. Ratio | 75 | 50 | 40 | 30 | 50 |
| Viscosity, centipoise | 590 | 662 | 704 | 762 | 600 |

| Example | SS | TT | UU | VV | WW |
|---|---|---|---|---|---|
| Ingredients, grams | | | | | |
| Epoxide I | 63.8 | 77.6 | 74.1 | 69.0 | 60.6 |
| Polyol VI | 0 | 17.9 | 21.4 | 26.5 | 34.9 |
| Polyol VII | 0 | 0 | 0 | 0 | 0 |
| Polyol VIII | 31.6 | 0 | 0 | 0 | 0 |
| Reactive Diluent I | 0 | 0 | 0 | 0 | 0 |
| Photo-Initiator I | 0 | 4.0 | 4.0 | 4.0 | 4.0 |
| Photo-Initiator II | 4.0 | 0 | 0 | 0 | 0 |
| Surfactant III | 0.5 | 0.5 | 0.5 | 0.5 | 0.5 |
| Properties | | | | | |
| Epoxy/OH Eq. Wt. Ratio | 30 | 50 | 40 | 30 | 20 |
| Viscosity, centipoise | 692 | 714 | 740 | 762 | 826 |

| Example | XX | YY | ZZ | AAA | BBB |
|---|---|---|---|---|---|
| Ingredients, | | | | | |

TABLE XI-continued

| | | | | | |
|---|---|---|---|---|---|
| Pencil Hardness | H | H | H | H | H |
| % Crosshatch Adhesion | 100 | 100 | 100 | 100 | 100 |

TABLE XII-continued

| grams | | | | | |
|---|---|---|---|---|---|
| Epoxide I | 74.1 | 60.6 | 79.9 | 73.9 | 69.9 |
| Polyol VI | 21.4 | 34.9 | 0 | 0 | 0 |
| Polyol VII | 0 | 0 | 15.6 | 21.6 | 25.6 |
| Polyol VIII | 0 | 0 | 0 | 0 | 0 |
| Reactive Diluent I | 0 | 0 | 0 | 0 | 0 |
| Photo-Initiator I | 0 | 0 | 4.0 | 4.0 | 4.0 |
| Photo-Initiator II | 4.0 | 4.0 | 0 | 0 | 0 |
| Surfactant III | 0.5 | 0.5 | 0.5 | 0.5 | 0.5 |
| Properties | | | | | |
| Epoxy/OH Eq. Wt. Ratio | 40 | 20 | 75 | 50 | 40 |
| Viscosity, centipoise | 630 | 756 | 554 | 616 | 669 |

| Example | CCC | DDD | EEE | 46 | 47 |
|---|---|---|---|---|---|
| Ingredients, grams | | | | | |
| Epoxide I | 64.2 | 73.9 | 64.2 | 71.3 | 62.3 |
| Polyol VI | 0 | 0 | 0 | 0 | 0 |
| Polyol VII | 31.3 | 21.6 | 31.3 | 0 | 0 |
| Polyol VIII | 0 | 0 | 0 | 14.2 | 23.2 |
| Reactive Diluent I | 0 | 0 | 0 | 10.0 | 10.0 |
| Photo-Initiator I | 4.0 | 0 | 0 | 0 | 0 |
| Photo-Initiator II | 0 | 4.0 | 4.0 | 4.0 | 4.0 |
| Surfactant III | 0.5 | 0.5 | 0.5 | 0.5 | 0.5 |
| Properties | | | | | |
| Epoxy/OH Eq. Wt. Ratio | 30 | 50 | 30 | 86 | 47 |
| Viscosity, centipoise | 732 | 562 | 671 | 194 | 242 |

| Example | 48 | 49 | 50 | 51 |
|---|---|---|---|---|
| Ingredients, grams | | | | |
| Epoxide I | 69.5 | 61.8 | 71.5 | 62.6 |
| Polyol VI | 16.0 | 23.7 | 0 | 0 |
| Polyol VII | 0 | 0 | 14.0 | 22.9 |
| Polyol VIII | 0 | 0 | 0 | 0 |
| Reactive Diluent I | 10.0 | 10.0 | 10.0 | 10.0 |
| Photoinitiator I | 0 | 0 | 0 | 0 |
| Photoinitiator II | 4.0 | 4.0 | 4.0 | 4.0 |
| Surfactant III | 0.5 | 0.5 | 0.5 | 0.5 |
| Properties | | | | |
| Epoxy/OH Eq. Wt. Ratio | 58 | 35 | 86 | 47 |
| Viscosity, centipoise | 218 | 254 | 182 | 226 |

Table XII shows that the viscosity of the blend formulations containing Reactive Diluent I, i.e., Examples 46 through 51, is significantly lower than the viscosity of Comparative Examples NN through EEE which do not contain Reactive Diluent I.

The blended formulations were then applied to Bonderite 37$^{(R)}$ treated steel panels using a Number 20 wirewound rod and cured with one pass under a 100 watt per inch, medium pressure, mercury lamp ultraviolet light source at 30 feet per minute. One Bonderite 37$^{(R)}$ treated steel panel coated with the specified blended formulation was prepared for each example and comparative example. The cured coating on the Bonderite 37$^{(R)}$ treated steel panels of Comparative Examples FFF through KKK and Examples 52 and 53 were prepared from the blended formulation of Comparative Examples NN though SS and Examples 46 and 47 respectively. The cured coating on the Bonderite 37$^{(R)}$ treated steel panels of Comparative Examples LLL through QQQ and Examples 54 and 55 was prepared from the blended formulation of Comparative Examples NN through SS and Examples 46 and 47 respectively. The cured coating on the Bondertie 37$^{(R)}$ treated steel panels of Comparative Examples RRR through WWW and Examples 56 and 57 was prepared from the blended formulation of Comparative Examples TT through YY and Examples 48 and 49 respectively. The cured coating of the Bonderite 37$^{(R)}$ treated steel panels of Comparative Examples XXX through CCCC and Examples 58 and 59 was prepared from the blended formulation of Comparative Examples TT through YY and Examples 48 and 49 respectively. The cured coating on the Bonderite 37$^{(R)}$ treated steel panels of Comparative Examples DDDD through IIII and Examples 60 and 61 was prepared from the blended formulations of Comparative Examples ZZ through EEE and Examples 50 and 51 respectively. The cured coating on the Bonderite 37$^{(R)}$ treated steel panels of Comparative Examples JJJJ through OOOO and Examples 62 and 63 was prepared from the blended formulation of Comparative Examples ZZ through EEE and Examples 50 and 51 respectively. The thickness of the coatings varied from about 0.8 mils to about 0.9 mils. The cured coatings were tack free immediately after ultraviolet light irradiation. Specifically designated cured coatings in Table XIII below were not post cured thermally and other specifically designated cured coatings in Table XIII were post cured thermally at 170° C. for 10 minutes before testing for the properties designated in Table XIII. The results of the testing are given in Table XIII.

TABLE XIII

| | Example | | | | | |
|---|---|---|---|---|---|---|
| Properties | FFF | GGG | HHH | III | JJJ | KKK |
| Double Acetone Rubs | 25 | 25 | 18 | 18 | 100 | 50 |
| | (4) | (4) | (4) | (4) | (1) | (4) |
| Pencil Hardness | F | F | F | F | H | H |
| % Crosshatch Adhesion | 100 | 100 | 100 | 100 | 100 | 100 |
| Thermal Post Cure | No | No | No | No | No | No |
| Gardner Impact, in. lbs. | | | | | | |
| Forward | 100 | >320 | >320 | >320 | >320 | >320 |
| Reverse | 175 | >320 | >320 | >320 | >320 | >320 |
| Moisture Resistance 24 Hr. Water Immersion at Room Temperature | | | | | | |
| Pencil Hardness | 2B | HB | HB | 2B | <5B | <5B |
| % Crosshatch Adhesion | 100 | 100 | 100 | 60 | 0 | 75 |
| 3 Hr. Water Immersion at 130° F. | | | | | | |

TABLE XIII-continued

| | | | | | | |
|---|---|---|---|---|---|---|
| Pencil Hardness | 2B | B | B | 2B | <5B | <5B |
| % Crosshatch Adhesion | 95 | 100 | 100 | 95 | 0 | 0 |

| | Example | | | | | |
|---|---|---|---|---|---|---|
| Properties | LLL | MMM | NNN | OOO | PPP | QQQ |
| Double Acetone Rubs | 65 (4) | 45 (4) | 90 (4) | 90 (4) | 100 (1) | 100 (1) |
| Pencil Hardness | H | F | F | F | 2H | H |
| % Crosshatch Adhesion | 100 | 100 | 100 | 100 | 100 | 100 |
| Thermal Post Cure | Yes | Yes | Yes | Yes | Yes | Yes |
| Gardner Impact, in. lbs. | | | | | | |
| Forward | >320 | >320 | >320 | >320 | >320 | >320 |
| Reverse | >320 | >320 | >320 | >320 | >320 | >320 |
| Moisture Resistance 24 Hr. Water Immersion at Room Temperature | | | | | | |
| Pencil Hardness | B | HB | HB | HB | HB | HB |
| % Crosshatch Adhesion | 100 | 100 | 100 | 80 | 100 | 100 |
| 3 Hr. Water Immersion at 130° F. | | | | | | |
| Pencil Hardness | HB | HB | HB | 2B | HB | F |
| % Crosshatch Adhesion | 100 | 100 | 100 | 100 | 100 | 100 |

| | Example | | | | | |
|---|---|---|---|---|---|---|
| Properties | RRR | SSS | TTT | UUU | VVV | WWW |
| Double Acetone Rubs | 100 (1) | 73 (4) | 43 (4) | 50 (4) | 100 (1) | 100 (1) |
| Pencil Hardness | HB | HB | HB | 2B | HB | 2B |
| % Crosshatch Adhesion | 100 | 100 | 100 | 100 | 100 | 100 |
| Thermal Post Cure | No | No | No | No | No | No |
| Gardner Impact, in. lbs. | | | | | | |
| Forward | 200 | >320 | >320 | >320 | 300 | >320 |
| Reverse | 75 | >320 | >320 | >320 | 275 | >320 |
| Moisture Resistance 24 Hr. Water Immersion at Room Temperature | | | | | | |
| Pencil Hardness | HB | HB | HB | 3B | <5B | <5B |
| % Crosshatch Adhesion | 100 | 100 | 100 | 100 | 0 | 0 |
| 3 Hr. Water Immersion at 130° F. | | | | | | |
| Pencil Hardness | 2B | 3B | 5B | 3B | <5B | <5B |
| % Crosshatch Adhesion | 100 | 100 | 100 | 90 | 0 | 0 |

| | Example | | | | | |
|---|---|---|---|---|---|---|
| Properties | XXX | YYY | ZZZ | AAAA | BBBB | CCCC |
| Double Acetone Rubs | 100 (1) | 100 (1) | 100 (1) | 100 (1) | 100 (1) | 100 (1) |
| Pencil Hardness | F | F | B | 2B | F | B |
| % Crosshatch Adhesion | 100 | 100 | 100 | 100 | 100 | 100 |
| Thermal Post Cure | Yes | Yes | Yes | Yes | Yes | Yes |
| Gardner Impact, in. lbs. | | | | | | |
| Forward | >320 | >320 | >320 | >320 | >320 | >320 |
| Reverse | >320 | >320 | >320 | >320 | >320 | >320 |
| Moisture Resistance 24 Hr. Water Immersion at Room Temperature | | | | | | |
| Pencil Hardness | HB | HB | B | 3B | F | B |
| % Crosshatch Adhesion | 100 | 100 | 100 | 100 | 100 | 100 |
| 3 Hr. Water Immersion at 130° F. | | | | | | |
| Pencil Hardness | F | HB | HB | HB | F | F |
| % Crosshatch Adhesion | 100 | 100 | 100 | 100 | 100 | 100 |

| | Example | | | | | |
|---|---|---|---|---|---|---|
| Properties | DDDD | EEEE | FFFF | GGGG | HHHH | IIII |
| Double Acetone Rubs | 100 (1) | 70 (4) | 52 (4) | 47 (4) | 90 (4) | 50 (4) |
| Pencil Hardness | H | F | F | F | H | F |
| % Crosshatch Adhesion | 100 | 100 | 100 | 100 | 100 | 100 |

TABLE XIII-continued

| | | | | | | |
|---|---|---|---|---|---|---|
| Thermal Post Cure | No | No | No | No | No | No |
| Gardner Impact, in. lbs. | | | | | | |
| Forward | >320 | >320 | >320 | >320 | 275 | >320 |
| Reverse | >320 | >320 | >320 | >320 | 250 | >320 |
| Moisture Resistance | | | | | | |
| 24 Hr. Water | | | | | | |
| Immersion at | | | | | | |
| Room Temperature | | | | | | |
| Pencil Hardness | 2B | F | B | B | B | 4B |
| % Crosshatch | | | | | | |
| Adhesion | 80 | 100 | 100 | 100 | 50 | 0 |
| 3 Hr. Water | | | | | | |
| Immersion at 130° F. | | | | | | |
| Pencil Hardness | 3B | 3B | B | HB | <5B | <5B |
| % Crosshatch | | | | | | |
| Adhesion | 100 | 100 | 100 | 90 | 0 | 0 |

| | Example | | | | | |
|---|---|---|---|---|---|---|
| Properties | JJJJ | KKKK | LLLL | MMMM | NNNN | OOOO |
| Double Acetone Rubs | 100 | 100 | 100 | 100 | 100 | 100 |
| | (1) | (1) | (1) | (1) | (1) | (1) |
| Pencil Hardness | F | F | F | HB | F | HB |
| % Crosshatch Adhesion | 100 | 100 | 100 | 100 | 100 | 100 |
| Thermal Post Cure | Yes | Yes | Yes | Yes | Yes | Yes |
| Gardner Impact, in. lbs. | | | | | | |
| Forward | >320 | >320 | >320 | >320 | 200 | >320 |
| Reverse | >320 | >320 | >320 | >320 | 150 | >320 |
| Moisture Resistance | | | | | | |
| 24 Hr. Water | | | | | | |
| Immersion at | | | | | | |
| Room Temperature | | | | | | |
| Pencil Hardness | 2B | F | B | HB | HB | HB |
| % Crosshatch | | | | | | |
| Adhesion | 100 | 100 | 100 | 100 | 100 | 100 |
| 3 Hr. Water | | | | | | |
| Immersion at 130° F. | | | | | | |
| Pencil Hardness | F | F | HB | HB | F | F |
| % Crosshatch | | | | | | |
| Adhesion | 100 | 100 | 100 | 100 | 100 | 100 |

| | Example | | | | | |
|---|---|---|---|---|---|---|
| Properties | 52 | 53 | 54 | 55 | 56 | 57 |
| Double Acetone Rubs | 100 | 70 | 100 | 100 | 100 | 100 |
| | (1) | (4) | (1) | (1) | (1) | (1) |
| Pencil Hardness | H | F | H | H | H | F |
| % Crosshatch Adhesion | 98 | 100 | 100 | 100 | 100 | 100 |
| Thermal Post Cure | No | No | Yes | Yes | No | No |
| Gardner Impact, in. lbs. | | | | | | |
| Forward | 75 | >320 | 150 | >320 | 125 | >320 |
| Reverse | 50 | 300 | 125 | >320 | 100 | >320 |
| Moisture Resistance | | | | | | |
| 24 Hr. Water | | | | | | |
| Immersion at | | | | | | |
| Room Temperature | | | | | | |
| Pencil Hardness | <5B | <5B | HB | HB | <5B | <5B |
| % Crosshatch | | | | | | |
| Adhesion | 0 | 0 | 100 | 100 | 0 | 0 |
| 3 Hr. Water | | | | | | |
| Immersion at 130° F. | | | | | | |
| Pencil Hardness | <5B | <5B | F | F | <5B | <5B |
| % Crosshatch | | | | | | |
| Adhesion | 0 | 0 | 100 | 100 | 0 | 0 |

| | Example | | | | | |
|---|---|---|---|---|---|---|
| Properties | 58 | 59 | 60 | 61 | 62 | 63 |
| Double Acetone Rubs | 100 | 100 | 100 | 80 | 100 | 100 |
| | (1) | (1) | (1) | (4) | (1) | (1) |
| Pencil Hardness | F | F | H | F | H | F |
| % Crosshatch Adhesion | 100 | 100 | 100 | 100 | 100 | 100 |
| Thermal Post Cure | Yes | Yes | No | No | Yes | Yes |
| Gardner Impact, in. lbs. | | | | | | |
| Forward | 225 | >320 | 125 | >320 | 175 | >320 |
| Reverse | 200 | >320 | 100 | >320 | 125 | >320 |
| Moisture Resistance | | | | | | |
| 24 Hr. Water | | | | | | |
| Immersion at | | | | | | |
| Room Temperature | | | | | | |
| Pencil Hardness | F | F | 4B | 4B | HB | HB |
| % Crosshatch | | | | | | |

TABLE XIII-continued

| | | | | | | |
|---|---|---|---|---|---|---|
| Adhesion 3 Hr. Water Immersion at 130° F. | 100 | 100 | 0 | 0 | 100 | 100 |
| Pencil Hardness | F | F | 4B | <5B | H | HB |
| % Crosshatch Adhesion | 100 | 100 | 0 | 0 | 100 | 100 |

Table XIII shows the properties of cured coatings which were prepared from blended formulations containing propylene oxide polyols capped with ethylene oxide, i.e., Polyol VI, Polyol VII and Polyol VIII. Copending U.S. patent application Ser. No. 464,580, filed on an even date herewith, now abandoned, describes photocopolymerizable compositions comprising an epoxide containing two or more epoxy groups, a poly (active hydrogen) organic compound having at least some primary hydroxyl content and a photinitiator.

EXAMPLES 64 THROUGH 67 AND COMPARATIVE EXAMPLES PPPP AND QQQQ

Into brown glass bottles under a yellow light source was added Epoxide I, Polyol I, Reactive Diluent I, Photoinitiator I, Surfactant III and Copolymer II in the amounts specified for each example and comparative example in Table XIV below. The contents in the bottles were thoroughly blended until homogeneous by simple stirring at ambient temperature. The viscosity of the resulting blends prepared in each example and comparative example was then determined with a Brookfield viscometer at ambient temperature. The viscosity results are given in Table XIV.

TABLE XIV

| Example | PPPP | 64 | 65 |
|---|---|---|---|
| Ingredients, grams | | | |
| Epoxide I | 80.02 | 71.76 | 70.26 |
| Polyol I | 15.48 | 13.88 | 13.59 |
| Reactive Diluent I | 0 | 9.86 | 9.65 |
| Photoinitiator I | 4.0 | 4.0 | 4.0 |
| Surfactant III | 0.5 | 0.5 | 0.5 |
| Copolymer II | 0 | 0 | 2.0 |
| Properties | | | |
| Viscosity, Centipoise | 342 | 130 | 108 |

Table XIV shows that the viscosity of the blend formulations containing Reactive Diluent I, i.e., Examples 64 and 65, is significantly lower than the viscosity of Comparative Example PPPP which does not contain Reactive Diluent I. The blend formulation of Example 65 containing Copolymer II shows a further lowering of the viscosity in comparison with the blend formulation of Example 64 which does not contain Copolymer II.

The blended formulations were then applied to Bonderite 37$^{(R)}$ treated steel panels using a Number 20 wire-wound rod and cured with one pass under a 100 watt per inch, medium pressure, mercury lamp ultraviolet light source at 30 feet per minute. One Bonderite 37$^{(R)}$ treated steel panel coated with the specified blended formulation was prepared for each example and comparative example. The cured coating on the Bonderite 37$^{(R)}$ treated steel panels of Comparative Example QQQQ and Examples 66 and 67 was prepared from the blended formulations of Comparative Example PPPP and Examples 64 and 65 respectively. The thickness of the coatings varied from about 0.8 mils to about 0.9 mils. The cured coatings were tack free immediately after ultraviolet light irradiation. The cured coatings in Table XV below were not post cured thermally before testing for the properties designated in Table XV. The results of the testing are given in Table XV.

TABLE XV

| | Example | | |
|---|---|---|---|
| Properties | QQQQ | 66 | 67 |
| Double Acetone Rubs | 100(1) | 100(1) | 100(1) |
| Pencil Hardness | 2H | 2H | H |
| % Crosshatch Adhesion | 100 | 100 | 100 |
| Gardner Impact, in. lbs. | | | |
| Forward | 75 | 75 | 75 |
| Reverse | 75 | 5 | 5 |

Table XV shows the properties of cured coatings which were prepared from blend formulations containing a polycaprolactone diol, i.e., Polyol I.

EXAMPLES 68 THROUGH 93

Into brown glass bottles under a yellow light source was added Epoxide I, Polyol II, Reactive Diluent I, Photoinitiator I, and Surfactant III in the amounts specified for each example in Table XVI below. The contents in the bottles were thoroughly blended until homogeneous by simple stirring at ambient temperature. The viscosity of the resulting blends prepared in each example was then determined with a Brookfield viscometer at 25.1° C. The viscosity results are given in Table XVI.

TABLE XVI

| Example | 68 | 69 | 70 | 71 | 72 |
|---|---|---|---|---|---|
| Ingredients, grams | | | | | |
| Reactive Diluent I | 10.0 | 5.0 | 10.0 | 5.0 | 10.0 |
| Polyol II | 13.7 | 13.7 | 17.2 | 17.2 | 20.0 |
| Epoxide I | 72.0 | 77.0 | 68.5 | 73.5 | 65.7 |
| Photoinitiator I | 4.0 | 4.0 | 4.0 | 4.0 | 4.0 |
| Surfactant III | 0.5 | 0.5 | 0.5 | 0.5 | 0.5 |
| Properties | | | | | |
| Epoxy/OH Eq. Wt. Ratio | 8 | 8 | 6 | 6 | 5 |
| Viscosity, centipoise | 182 | 302 | 192 | 320 | 202 |
| Example | 73 | 74 | 75 | 76 | 77 |
| Ingredients, grams | | | | | |
| Reactive Diluent I | 5.0 | 10.0 | 10.0 | 10.0 | 10.0 |
| Polyol II | 20.0 | 20.6 | 21.6 | 22.4 | 23.7 |
| Epoxide I | 70.7 | 65.1 | 64.1 | 63.3 | 62.0 |
| Photoinitiator I | 4.0 | 4.0 | 4.0 | 4.0 | 4.0 |
| Surfactant III | 0.5 | 0.5 | 0.5 | 0.5 | 0.5 |
| Properties | | | | | |
| Epoxy/OH Eq. Wt. Ratio | 5 | 4.8 | 4.5 | 4.3 | 4.0 |
| Viscosity, centipoise | 329 | 190 | 192 | 202 | 208 |

The blended formulations were then applied to Bonderite 37(R) treated steel panels using a Number 20 wire-wound rod and cured with one pass under a 100 watt per inch, medium pressure, mercury lamp ultraviolet light source at 30 feet per minute. One Bonderite 37(R) treated steel panel coated with the specified blended formulation was prepared with the specified blended formulation was prepared for each example. The cured coating on the Bonderite 37(R) treated steel panels of Examples 78 through 87 was prepared from the blended formulations of Examples 68 through 77 respectively. The cured coating on the Bonderite 37(R) treated steel panels of Examples 88 through 93 was prepared from the blended formulations of Examples 68 through 73 respectively. The thickness of the coatings varied from about 0.8 mils to about 0.9 mils. The cured coatings were tack free immediately after ultraviolet light irradiation. Specifically designated cured coatings in Table XVII below were not post cured thermally and other specifically designated cured coatings in Table XVII were post cured thermally at 54.5° C. for 10 minutes before testing for the properties designated in Table XVII. The results of the testing are given in Table XVII.

TABLE XVII

| Properties | Examples | | | | |
|---|---|---|---|---|---|
| | 78 | 79 | 80 | 81 | 82 |
| Double Acetone Rubs | 100 (1) | 100 (1) | 100 (1) | 100 (1) | 100 (1) |
| Pencil Hardness | H | H | H | H | H |
| % Crosshatch Adhesion | 100 | 100 | 100 | 100 | 100 |
| Thermal Post Cure | No | No | No | No | No |
| Gardner Impact, in. lbs. | | | | | |
| Foward | 15 | 15 | 15 | 15 | 15 |
| Reverse | <5 | <5 | <5 | <5 | <5 |

| Properties | Examples | | | | |
|---|---|---|---|---|---|
| | 83 | 84 | 85 | 86 | 87 |
| Double Acetone Rubs | 100 (1) | 100 (1) | 100 (1) | 60 (2) | 100 (1) |
| Pencil Hardness | H | H | H | H | H |
| % Crosshatch Adhesion | 100 | 100 | 100 | 100 | 100 |
| Thermal Post Cure | No | No | No | No | No |
| Gardner Impact, in. lbs. | | | | | |
| Forward | 15 | 25 | 25 | 25 | 50 |
| Reverse | <5 | <5 | <5 | <5 | 25 |

| Properties | Examples | | | | | |
|---|---|---|---|---|---|---|
| | 88 | 89 | 90 | 91 | 92 | 93 |
| Double Acetone Rubs | 100 (1) | 100 (1) | 100 (1) | 100 (1) | 100 (1) | 100 (1) |
| Pencil Hardness | H | H | H | H | H | H |
| % Crosshatch Adhesion | 100 | 100 | 100 | 100 | 100 | 100 |
| Thermal Post Cure | Yes | Yes | Yes | Yes | Yes | Yes |
| Gardner Impact, in. lbs. | | | | | | |
| Forward | 15 | 25 | 25 | 25 | 50 | 25 |
| Reverse | <5 | 25 | 5 | 25 | 50 | 25 |

Table XVII shows the properties of cured coatings which were prepared from blend formulations containing a polycaprolactone triol, i.e. Polyol II.

EXAMPLES 94 THROUGH 101

Into brown glass bottles under a yellow light source was added Epoxide I, Polyol II, Reactive Diluent I, Copolymer III, Photoinitiator I, Photoinitiator II and Surfactant III in the amounts specified for each example in Table XVIII below. The contents in the bottles were thoroughly blended until homogeneous by simply stirring at ambient temperature. The viscosity of the resulting blends prepared in each example was the determined with a Brookfield viscometer at 24.4° C. The viscosity results are given in Table XVIII.

TABLE XVIII

| Example | 94 | 95 | 96 | 97 |
|---|---|---|---|---|
| Ingredients, grams | | | | |
| Epoxide I | 54.43 | 54.43 | 55.95 | 49.74 |
| Polyol II | 23.85 | 23.85 | 24.51 | 21.79 |
| Reactive Diluent I | 8.20 | 8.20 | 8.42 | 7.49 |
| Copolymer III | 9.02 | 9.02 | 9.27 | 16.48 |
| Photoinitiator I | 4.0 | 0 | 0 | 4.0 |
| Photoinitiator II | 0 | 4.0 | 1.35 | 0 |
| Surfactant III | 0.5 | 0.5 | 0.5 | 0.5 |
| Properties | | | | |
| Viscosity, centipoise | 1346 | 1140 | 1264 | 5060 |

Blended formulations having high viscosity as above can have utility in the printing ink, encapsulant areas and the like.

The blended formulations were then applied to Bonderite 37(R) treated steel panels using a Number 20 wire-wound rod and cured with one pass under a 100 watt per inch, medium pressure, mercury lamp ultraviolet light source at 30 feet per minute. One Bonderite 37(R) treated steel panel coated with the specified blended formulation was prepared for each example. The cured coating on the Bonderite 37(R) treated steel panels of Example 98 through 101 was prepared from the blended formulations of Examples 94 through 97 respectively. The thickness of the coatings varied from about 0.3 mils to about 1.1 mils. The cured coatings were tack free immediately after ultraviolet light irradiation. The cured coatings in Table XIX below were not post cured thermally before testing for the properties designated in Table XIX. The results of the testing are given in Table XIX.

TABLE XIX

| Properties | Example | | | |
|---|---|---|---|---|
| | 98 | 99 | 100 | 101 |
| Double Acetone Rubs | 60(4) | 75(4) | 45(4) | 45(4) |
| Pencil Hardness | F | F | H | F |
| % Crosshatch Adhesion | 100 | 100 | 100 | 100 |
| Gardner Impact, in. lbs. | | | | |
| Forward | >320 | >320 | >320 | >320 |
| Reverse | >320 | >320 | >320 | >320 |

Table XIX shows the properties of cured coatings which were prepared from blend formulations containing Copolymer III.

EXAMPLES 102 THROUGH 107

Into brown glass bottles under a yellow light source was added Epoxide I, Epoxide II, Polyol II, Reactive Diluent I, Photoinitiator I, Photoinitiator II and Surfactant III in the amounts specified for each example in Table XX below. The contents in the bottles were thoroughly blended until homogeneous by simple stirring at ambient temperature.

TABLE XX

| Ingredients, grams | Example | |
|---|---|---|
| | 102 | 103 |
| Epoxide I | 48.64 | 48.64 |

TABLE XX-continued

| Ingredients, grams | Example 102 | 103 |
|---|---|---|
| Epoxide II | 14.63 | 14.63 |
| Polyol II | 21.28 | 21.28 |
| Reactive Diluent I | 10.97 | 10.97 |
| Photoinitiator I | 4.0 | 0 |
| Photoinitiator II | 0 | 4.0 |
| Surfactant III | 0.5 | 0.5 |

The blended formulations were then applied to Bonderite 37$^{(R)}$ treated steel panels using a Number 20 wire-wound rod and cured with one pass under a 100 watt per inch, medium pressure, mercury lamp ultraviolet light source at 30 feet per minute. One Bonderite 37$^{(R)}$ treated steel panel coated with the specified blended formulation was prepared for each example. The cured coating on the Bonderite 37$^{(R)}$ treated steel panels of Examples 104 and 105 was prepared from the blended formulation of Example 102. The cured coating on the Bonderite 37$^{(R)}$ treated steel panels of Examples 105 and 107 was prepared from the blended formulation of Example 103. The thickness of the coatings varied from about 0.3 mils to about 1.1. mils. The cured coatings were tack free immediately after the ultraviolet light irradiation. Specifically designated cured coatings in Table XXI below were not post cured thermally and other specifically designated cured coatings in Table XXI were post cured thermally at 54.5° C. for 10 minutes before testing for the properties designated in Table XXI. The results of the testing are given in Table XXI.

TABLE XXI

| Example | 104 | 105 | 106 | 107 |
|---|---|---|---|---|
| Properties | | | | |
| Double Acetone Rubs | 90(3) | 90(4) | 100(2) | 100(1) |
| Pencil Hardness | H | H | H | H |
| % Crosshatch Adhesion | 100 | 100 | 100 | 100 |
| Thermal Post Cure | No | No | Yes | Yes |
| Gardner Impact, in. lbs. | | | | |
| Forward | >320 | >320 | 100 | >320 |
| Reverse | >320 | >320 | 75 | >320 |

Table XXI shows the properties of cured coatings which were prepared from blend formulations containing both Epoxide I and Epoxide II.

EXAMPLES 108 THROUGH 129

Into brown glass bottles under a yellow light source was added Epoxide I, Polyol II, Polyol III, Polyol IV, Reactive Diluent I, Photoinitiator I, Photoinitiator II, Surfactant III and Copolymer II in amounts specified for each example in Table XXII below. The contents in the bottles were thoroughly blended until homogenous by simple stirring at ambient temperature. The viscosity of the resulting blends prepared in each example was then determined with a Brookfield viscometer at 25.5° C. The viscosity results are given in Table XXII.

TABLE XXII

| Example | 108 | 109 | 110 | 111 | 112 | 113 |
|---|---|---|---|---|---|---|
| Ingredients, grams | | | | | | |
| Epoxide I | 66.0 | 66.0 | 65.97 | 65.97 | 61.02 | 61.02 |
| Polyol II | 0 | 0 | 1.05 | 1.05 | 1.0 | 1.0 |
| Polyol III | 8.5 | 8.5 | 7.5 | 7.5 | 8.5 | 8.5 |
| Polyol IV | 9.0 | 9.0 | 9.0 | 9.0 | 9.0 | 9.0 |
| Reactive Diluent I | 10.0 | 10.0 | 9.98 | 9.98 | 13.98 | 13.98 |
| Photoinitiator I | 4.0 | 0 | 4.0 | 0 | 4.0 | 0 |
| Photoinitiator II | 0 | 4.0 | 0 | 4.0 | 0 | 4.0 |
| Surfactant III | 0.5 | 0.5 | 0.5 | 0.5 | 0.5 | 0.5 |
| Copolymer II | 2.0 | 2.0 | 2.0 | 2.0 | 2.0 | 2.0 |
| Properties | | | | | | |
| Viscosity, centipoise | 148 | 130 | 146 | 135 | 108 | 98 |

| Example | 114 | 115 | 116 | 117 | 118 |
|---|---|---|---|---|---|
| Ingredients, grams | | | | | |
| Epoxide I | 58.4 | 58.27 | 57.27 | 2275 | 2249 |
| Polyol II | 1.0 | 0.8 | 0.8 | 55 | 990 |
| Polyol III | 26.6 | 26.75 | 26.75 | 319 | 0 |
| Polyol IV | 0 | 0 | 0 | 338 | 0 |
| Reactive Diluent I | 9.5 | 9.68 | 9.68 | 520 | 342 |
| Photoinitiator I | 0 | 0 | 0 | 0 | 150 |
| Photoinitiator II | 4.0 | 4.0 | 4.0 | 0 | 0 |
| Surfactant III | 0.5 | 0.5 | 0.5 | 19 | 18.75 |
| Copolymer II | 0 | 0 | 2.0 | 75 | 0 |
| Properties | | | | | |
| Viscosity, centipoise | 192 | 190 | 156 | 98 | 228 |

The blended formulations were then applied to Bonderite 37$^{(R)}$ treated steel panels using a Number 20 wire-wound rod and cured with one pass under a 100 watt per inch, medium pressure, mercury lamp ultraviolet light source at 30 feet per minute. One Bonderite 37$^{(R)}$ treated steel panel coated with the specified blended formulation was prepared for each example. The cured coating on the Bonderite 37$^{(R)}$ treated steel panels of Examples 119 through 124 was prepared from the blended formulations of Examples 108 through 113 respectively. The cured coating on the Bonderite 37$^{(R)}$ treated steel panels of Examples 125 through 127 was prepared from the blended formulations of Examples 114 through 116 respectively. The cured coating on the Bonderite 37$^{(R)}$ treated steel panels of Examples 128 and 129 was prepared from the blended formulations of Examples 117 and 118 respectively. The thickness of the coatings varied from about 0.3 mils to about 1.1 mils. The cured coatings were tack free immediately after ultraviolet light irradiation. The cured coatings in Table XXIII below were not post cured thermally before testing for the properties designated in Table XXIII. The results of the testing are given in Table XXIII.

TABLE XXIII

| Properties | Example 119 | 120 | 121 | 122 | 123 | 124 |
|---|---|---|---|---|---|---|
| Double Acetone Rubs | 75 (4) | 100 (1) | 60 (4) | 100 (1) | 50 (4) | 100 (1) |
| Pencil Hardness | F | H | F | H | F | H |
| % Crosshatch Adhesion | 100 | 100 | 100 | 100 | 100 | 100 |
| Gardner Impact, in. lbs. | | | | | | |
| Forward | >320 | >320 | >320 | >320 | >320 | >320 |
| Reverse | >320 | >320 | >320 | >320 | >320 | >320 |

Example

TABLE XXIII-continued

| Properties | 125 | 126 | 127 | 128 | 129 |
|---|---|---|---|---|---|
| Double Acetone Rubs | 100 (1) | 100 (1) | 100 (1) | 100 (2) | 100 (1) |
| Pencil Hardness | H | F | F | H | H |
| % Crosshatch Adhesion | 100 | 100 | 100 | 100 | 100 |
| Gardner Impact in. lbs. | | | | | |
| Forward | >320 | >320 | >320 | >320 | >320 |
| Reverse | >320 | >320 | >320 | 275 | 250 |

Table XXIII shows the properties of cured coatings which were prepared from blend formulations containing both Polyol III and Polyol IV and also blend formulations containing combinations of Polyol II, Polyol III and Polyol IV.

EXAMPLES 130 THROUGH 134

Into brown glass bottles under a yellow light source was added Epoxide I, Polyol II, Polyol III, Polyol IV, Reactive Diluent I, Copolymer II, Photoinitiator I, Photoinitiator II and Surfactant III in the amounts specified for each example in Table XXIV below. The contents in the bottles were thoroughly blended until homogeneous by simple stirring at ambient temperature. The viscosity of the resulting blends prepared in each example was then determined with a Brookfield viscometer at ambient temperature. The viscosity results are given in Table XXIV.

TABLE XXIV

| Example | 130 | 131 |
|---|---|---|
| Ingredients, grams | | |
| Epoxide I | 34.57 | 61.02 |
| Polyol II | 26.41 | 1.0 |
| Polyol III | 0 | 8.5 |
| Polyol IV | 0 | 9.0 |
| Reactive Diluent I | 9.12 | 13.98 |
| Copolymer II | 0 | 2.0 |
| Photoinitiator I | 0 | 4.0 |
| Photoinitiator II | 4.0 | 0 |
| Surfactant III | 0.5 | 0.5 |
| Properties | | |
| Viscosity, centipoise | 204 | 108 |

The blended formulations were then applied to a K-Clear vinyl plastic film covering (commercially available fro Ex-Cell Home Fashions, Inc.) and Mylar polyethylene terephthalate film covering (commercially available from E. I. duPont de Nemours Company). the film coverings had previously been taped to Bonderite 37(R) treated steel panels to keep the film coverings in a flat position. The blended formulations were applied using a Number 20 wire-wound rod and cured with one pass under a 100 watt per inch, medium pressure, mercury lamp ultraviolet light source at 60 feet per minute. One film covering coated with the specified blended formulation was prepared for each example. The cured coating on the film covering of Examples 132 and 133 was prepared from the blended formulation of Example 130. The cured coating on the film covering of Example 134 was prepared from the blended formulation of Example 131. The thickness of the coatings varied from about 0.3 mils to about 1.1 mils. The cured coatings were tack free immediately after ultraviolet light irradiation. The cured coatings in Table XXV below were not post cured thermally before testing for the properties designated in Table XXV.

TABLE XXV

| Example | 132 | 133 | 134 |
|---|---|---|---|
| Double Acetone Rubs | 100(1) | 80(3) | 100(1) |
| Percent Adhesion | 100 | 100 | 100 |
| Film Covering | Vinyl | Mylar | Vinyl |

The adhesion was measured by well contacting and removing a pressure-sensitive adhesive tape applied over the cured coating near and including a section of the film covering that was not coated. The crosshatch adhesion test was not used.

Table XXV shows the properties of cured coatings on both vinyl and Mylar film coverings which coatings were prepared from blended formulations containing Polyol II alone and also Polyol II, Polyol III and Polyol IV in combination.

EXAMPLES 135 THROUGH 146 AND COMPARATIVE EXAMPLES RRRR THROUGH AAAAAA

Into brown glass bottles under a yellow light source was added Epoxide I, Polymer/Polyol I, Polymer/Polyol II, Reactive Diluent I, Photoinitiator I, Photoinitiator II and Surfactant III in the amounts specified in each example and comparative example in Table XXVI below. The contents in the bottles were thoroughly blended until homogeneous by simple stirring at ambient temperature. The viscosity of the resulting blends prepared in each example and comparative example was then determined with a Brookfield viscometer at ambient temperature. The viscosity results are given in Table XXVI.

TABLE XXVI

| | Example | | | | | |
|---|---|---|---|---|---|---|
| | RRRR | SSSS | TTTT | UUUU | VVVV | WWWW |
| Ingredients, grams | | | | | | |
| Epoxide I | 79.0 | 73.6 | 70.4 | 66.1 | 73.6 | 66.1 |
| Polymer/ Polyol I | 16.5 | 21.9 | 25.1 | 29.4 | 21.9 | 29.4 |
| Polymer/ Polyol II | 0 | 0 | 0 | 0 | 0 | 0 |
| Reactive Diluent I | 0 | 0 | 0 | 0 | 0 | 0 |
| Photo- Initiator I | 4.0 | 4.0 | 4.0 | 4.0 | 0 | 0 |
| Photo- Initiator II | 0 | 0 | 0 | 0 | 4.0 | 4.0 |
| Surfactant III | 0.5 | 0.5 | 0.5 | 0.5 | 0.5 | 0.5 |
| Properties | | | | | | |

TABLE XXVI-continued

| | | | | | | |
|---|---|---|---|---|---|---|
| Viscosity, centipoise | 657 | 1032 | 1094 | 1217 | 888 | 1082 |
| Epoxy/OH Eq. Wt. Ratio | 85 | 60 | 50 | 40 | 60 | 40 |

| | Example | | | | |
|---|---|---|---|---|---|
| | XXXX | YYYY | ZZZZ | AAAAA | BBBBB |
| Ingredients, grams | | | | | |
| Epoxide I | 79.9 | 73.9 | 69.9 | 64.2 | 73.9 |
| Polymer/Polyol I | 0 | 0 | 0 | 0 | 0 |
| Polymer/Polyol II | 15.6 | 21.6 | 25.6 | 31.3 | 21.6 |
| Reactive Diluent I | 0 | 0 | 0 | 0 | 0 |
| Photoinitiator I | 4.0 | 4.0 | 4.0 | 4.0 | 0 |
| Photoinitiator II | 0 | 0 | 0 | 0 | 4.0 |
| Surfactant III | 0.5 | 0.5 | 0.5 | 0.5 | 0.5 |
| Properties | | | | | |
| Viscosity, centipoise | 591 | 819 | 924 | 1090 | 864 |
| Epoxy/OH Eq. Wt. Ratio | 75 | 50 | 40 | 30 | 50 |

| | Example | | | | |
|---|---|---|---|---|---|
| | CCCCC | 135 | 136 | 137 | 138 |
| Ingredients, grams | | | | | |
| Epoxide I | 64.2 | 70.7 | 63.0 | 71.5 | 62.6 |
| Polymer/Polyol I | 0 | 14.8 | 22.5 | 0 | 0 |
| Polymer/Polyol II | 31.3 | 0 | 0 | 14.0 | 22.9 |
| Reactive Diluent I | 0 | 10.0 | 10.0 | 10.0 | 10.0 |
| Photoinitiator I | 0 | 0 | 0 | 0 | 0 |
| Photoinitiator II | 4.0 | 4.0 | 4.0 | 4.0 | 4.0 |
| Surfactant III | 0.5 | 0.5 | 0.5 | 0.5 | 0.5 |
| Properties | | | | | |
| Viscosity, centipoise | 1320 | 252 | 322 | 251 | 516 |
| Epoxy/OH Eq. Wt. Ratio | 30 | 98 | 59 | 86 | 47 |

Table XXVI shows that the viscosity of the blend formulations containing Reactive Diluent I, i.e., Examples 135 through 138, is significantly lower than the viscosity of comparative Examples RRRR through CCCCC which do not contain Reactive Diluent I.

The blended formulations were then applied to Bonderite 37$^{(R)}$ treated steel panels using a Number 20 wire-wound rod and cured with one pass under a 100 watt per inch, medium pressure, mercury lamp ultraviolet light source at 30 feet per minute. One Bonderite 37$^{(R)}$ treated steel panel coated with the specified blended formulation was prepared for each example and comparative example. The cured coating on the Bonderite 37$^{(R)}$ treated steel panels of Comparative Examples PPPPP through UUUUU and Examples 143 and 144 was prepared from the blended formulations of Comparative Examples XXXX through CCCCC and Examples 137 and 138 respectively. The cured coating on the Bonderite 37$^{(R)}$ treated steel panels of Comparative Examples VVVVV through AAAAAA and Examples 145 and 146 was prepared from the blended formulations of Comparative Examples XXXX through CCCCC and Examples 137 and 138 respectively. The cured coating on the Bonderite 37$^{(R)}$ treated steel panels of Comparative Examples DDDDD through IIIII and Examples 139 and 140 was prepared from the blended formulations of Comparative Examples RRRR through WWWW and Examples 135 and 136 respectively. The cured coating on the Bonderite 37$^{(R)}$ treated steel panels of Comparative Examples JJJJJ through OOOOO and Examples 141 and 142 was prepared from the blended formulations of Comparative Examples RRRR the WWWW and Examples 135 and 136 respectively. The thickness of the coatings varied from about 0.8 to about 0.9 mils. The cured coatings were tack free immediately after ultraviolet light irradiation. Specifically designated cured coatings in Tables XXVII below were not post cured thermally and other specifically designated cured coatings in Table XXVII were post cured thermally at 54.5° C. for 10 minutes before testing for the properties designated in Table XXVII. The results of the testing are given in Table XXVII.

TABLE XXVII

| | Examples | | | | |
|---|---|---|---|---|---|
| Properties | DDDDD | EEEEE | FFFFF | GGGGG | HHHHH |
| Double Acetone Rubs | 100(2) | 100(4) | 55(4) | 40(4) | 100(1) |
| Pencil Hardness | F | F | F | F | H |
| % Crosshatch Adhesion | 100 | 100 | 100 | 100 | 100 |
| Thermal Post cure | No | No | No | No | No |
| Gardner Impact, in. lbs. | | | | | |
| Forward | >320 | 150 | 225 | >320 | 150 |
| Reverse | >320 | 150 | 200 | 300 | 100 |
| Moisture Resistance 24 Hr. Water Immersion at | | | | | |

TABLE XXVII-continued

| | | | | | |
|---|---|---|---|---|---|
| Room Temperature Pencil Hardness | 5B | 4B | 3B | HB | 3B |
| % Crosshatch Adhesion | 100 | 100 | 50 | 100 | 0 |
| 3 Hr. Water Immersion at 130° F. Pencil Hardness | 2B | 5B | 5B | 3B | <5B |
| % Crosshatch Adhesion | 100 | 100 | 20 | 100 | 0 |

| | Examples | | | | |
|---|---|---|---|---|---|
| Properties | IIIII | JJJJJ | KKKKK | LLLLL | MMMMM |
| Double Acetone Rubs | 60(4) | 100(1) | 100(1) | 60(4) | 45(4) |
| Pencil Hardness | F | F | F | F | F |
| % Crosshatch Adhesion | 100 | 100 | 100 | 100 | 100 |
| Thermal Post cure | No | Yes | Yes | Yes | Yes |
| Gardner Impact, in. lbs. | | | | | |
| Forward | >320 | >320 | >320 | >320 | >320 |
| Reverse | >320 | >320 | >320 | >320 | >320 |
| Moisture Resistance 24 Hr. Water Immersion at Room Temperature Pencil Hardness | 2B | HB | 2B | HB | HB |
| % Crosshatch Adhesion | 0 | 100 | 100 | 100 | 100 |
| 3 Hr. Water Immersion at 130° F. Pencil Hardness | 3B | F | HB | HB | HB |
| % Crosshatch Adhesion | 30 | 100 | 100 | 100 | 100 |

| | Examples | | | | |
|---|---|---|---|---|---|
| Properties | NNNNN | OOOOO | PPPPP | QQQQQ | RRRRR |
| Double Acetone Rubs | 100(1) | 100(1) | 100(3) | 100(2) | 100(2) |
| Pencil Hardness | H | F | F | F | F |
| % Crosshatch Adhesion | 100 | 100 | 100 | 100 | 100 |
| Thermal Post cure | Yes | Yes | No | No | No |
| Gardner Impact, in. lbs. | | | | | |
| Forward | 300 | >320 | 225 | 125 | >320 |
| Reverse | 275 | >320 | 200 | 100 | 275 |
| Moisture Resistance 24 Hr. Water Immersion at Room Temperature Pencil Hardness | HB | HB | 2B | 3B | 4B |
| % Crosshatch Adhesion | 100 | 100 | 100 | 100 | 100 |
| 3 Hr. Water Immersion at 130° F. Pencil Hardness | HB | HB | 3B | HB | 2B |
| % Crosshatch Adhesion | 100 | 100 | 100 | 100 | 100 |

| | Examples | | | | |
|---|---|---|---|---|---|
| Properties | SSSSS | TTTTT | UUUUU | VVVVV | WWWWW |
| Double Acetone Rubs | 65(4) | 100(1) | 100(1) | 100(2) | 100(1) |
| Pencil Hardness | H | H | H | F | H |
| % Crosshatch Adhesion | 100 | 100 | 100 | 100 | 100 |
| Thermal Post cure | No | No | No | Yes | Yes |
| Gardner Impact, in. lbs. | | | | | |
| Forward | >320 | 175 | >320 | 50 | >320 |
| Reverse | >320 | 150 | >320 | 25 | >320 |
| Moisture Resistance 24 Hr. Water Immersion at | | | | | |

TABLE XXVII-continued

|  | | | | | |
|---|---|---|---|---|---|
| Room Temperature Pencil Hardness | 4B | <5B | 4B | F | HB |
| % Crosshatch Adhesion | 100 | 0 | 0 | 100 | 100 |
| 3 Hr. Water Immersion at 130° F. Pencil Hardness | F | <5B | B | F | HB |
| % Crosshatch Adhesion | 100 | 0 | 0 | 100 | 100 |

| | Examples | | | | |
|---|---|---|---|---|---|
| Properties | XXXXX | YYYYY | ZZZZZ | AAAAAA | 139 |
| Double Acetone Rubs | 100(1) | 100(1) | 100(1) | 100(1) | 100(1) |
| Pencil Hardness | H | H | H | H | H |
| % Crosshatch Adhesion | 100 | 100 | 100 | 100 | 100 |
| Thermal Post cure | Yes | Yes | Yes | Yes | No |
| Gardner Impact, in. lbs. | | | | | |
| Forward | >320 | >320 | >320 | >320 | 40 |
| Reverse | >320 | >320 | 300 | >320 | 25 |
| Moisture Resistance 24 Hr. Water Immersion at Room Temperature Pencil Hardness | HB | HB | F | H | <5B |
| % Crosshatch Adhesion | 100 | 100 | 90 | 100 | 0 |
| 3 Hr. Water Immersion at 130° F. Pencil Hardness | HB | F | F | F | <5B |
| % Crosshatch Adhesion | | 100 | 100 | 15 | 100 | 0 |

| | Examples | | | | | | |
|---|---|---|---|---|---|---|---|
| Properties | 140 | 141 | 142 | 143 | 144 | 145 | 146 |
| Double Acetone Rubs | 70 (4) | 100 (1) | 100 (1) | 100 (1) | 100 (1) | 100 (1) | 100 (2) |
| Pencil Hardness | H | H | H | H | H | H | H |
| % Crosshatch Adhesion | 100 | 100 | 100 | 98 | 100 | 100 | 100 |
| Thermal Post Cure | No | Yes | Yes | No | No | Yes | Yes |
| Gardner Impact, in. lbs. | | | | | | | |
| Forward | 150 | 150 | >320 | 15 | 25 | 125 | >320 |
| Reverse | 150 | 75 | >320 | <5 | <5 | 100 | >320 |
| Moisture Resistance 24 Hr. Water Immersion at Room Temperature Pencil Hardness | 2B | F | HB | 5B | <5B | H | F |
| % Crosshatch Adhesion | 0 | 100 | 100 | 0 | 0 | 100 | 100 |
| 3 Hr. Water Immersion at 130° F. Pencil Hardness | <5B | F | F | <5B | <5B | H | F |
| % Crosshatch Adhesion | 0 | 100 | 100 | 0 | 0 | 15 | 80 |

Table XXVII shows the properties of cured coatings which were prepared from blend formulations containing Polymer/Polyol I or Polymer/Polyol II. Copending U.S. patent application Ser. No. 464,563, filed on an even date herewith, now U.S. Pat. No. 4,593,051, describes photocopolymerizable compositions comprising an epoxide containing two or more epoxy groups, a polymer/poly (active hydrogen) organic compund and a photoinitiator.

We claim:

1. A photocopolymerizable composition comprising a cycloaliphatic diepoxide, a polycaprolactone polyol, vinylcyclohexene monoepoxide and an onium salt photoinitiator.

2. A photocopolymerizable composition as defined in claim 1 wherein the polycaprolactone polyol is a poycaprolactone diol.

3. A photocopolymerizable composition as defined in claim 1 wherein the polycaprolactone polyol is a polycaprolactone triol.

4. A photocopolymerizable composition comprising 3,4-epoxycyclohexylmethyl-3,4-epoxycyclohexane carboxylate, a polycaprolactone polyol, vinylcyclohexene monoepoxide, and an onium salt photoinitiator.

5. A photocopolymerizable composition as defined in claim 4 wherein the polycaprolactone polyol is a polycaprolactone diol.

6. A photocopolymerizable composition as defined in claim 4 wherein the polycaprolactone polyol is a polycaprolactone triol.

7. A photocopolymerizable composition comprising bis-(3,4-epoxycyclohexylmethyl) adipate, a polycaprolactone polyol, vinylcyclohexene monoepoxide and an onium salt photoinitiator.

8. A photocopolymerizable composition as defined in claim 7 wherein the polycaprolactone polyol is a polycaprolactone diol.

9. A photocopolymerizable composition as defined in claim 7 wherein the polycaprolactone polyol is a polycaprolactone triol.

10. A photocopolymerizable composition as defined in claim 1 wherein the onium salt photoinitiator is a triarylsulfonium hexafluorophosphate.

11. A photocopolymerizable composition as defined in claim 1 wherein the onium salt photoinitiator is a triarylsulfonium hexafluorantimony salt.

12. The cured product of the composition defined in claim 1.

* * * * *